United States Patent
Koyama et al.

(10) Patent No.: US 8,830,004 B2
(45) Date of Patent: Sep. 9, 2014

(54) CRYSTAL RESONATOR AND CRYSTAL OSCILLATOR

(75) Inventors: Mitsuaki Koyama, Saitama (JP); Toshihiko Kagami, Saitama (JP); Takeshi Matsumoto, Saitama (JP); Takeru Mutoh, Saitama (JP); Manabu Ishikawa, Saitama (JP); Shinichi Sato, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 38 days.

(21) Appl. No.: 13/559,601

(22) Filed: Jul. 27, 2012

(65) Prior Publication Data

US 2013/0027141 A1 Jan. 31, 2013

(30) Foreign Application Priority Data

Jul. 29, 2011 (JP) ................. 2011-167028
Jul. 5, 2012 (JP) ................. 2012-151522

(51) Int. Cl.
*H03H 9/19* (2006.01)
*G01N 5/02* (2006.01)
*H03H 3/02* (2006.01)
*H03H 9/02* (2006.01)

(52) U.S. Cl.
CPC .. *H03H 3/02* (2013.01); *H03H 9/02* (2013.01)
USPC .............. 331/66; 331/158; 331/162; 310/320

(58) Field of Classification Search
USPC .............................. 331/66, 162, 158; 310/320
See application file for complete search history.

(56) References Cited

U.S. PATENT DOCUMENTS 8,049,581 B2 * 11/2011 Iwasaki et al. ................. 333/187
8,298,486 B2 * 10/2012 Watanabe et al. ........... 422/82.01
2005/0099092 A1 * 5/2005 Nakamura et al. ............ 310/320

FOREIGN PATENT DOCUMENTS

| JP | 2003-069374 | 3/2003 |
|----|-------------|--------|
| JP | 2007-108170 | 4/2007 |
| JP | 2009-206792 | 9/2009 |
| JP | 2010-151769 | 7/2010 |
| JP | 4566252 | 8/2010 |
| JP | 4611959 | 10/2010 |
| JP | 2011-135342 | 7/2011 |
| JP | 2011-188373 | 9/2011 |
| JP | 4865002 | 11/2011 |
| JP | 2011-252932 | 12/2011 |
| JP | 4897408 | 1/2012 |

* cited by examiner

*Primary Examiner* — Joseph Chang
(74) *Attorney, Agent, or Firm* — Jianq Chyun IP Office

(57) ABSTRACT

A crystal resonator comprises a first vibrating region provided on a crystal wafer, a second vibrating region provided on the crystal wafer, the second vibrating region having a different thickness and positive/negative orientation of the X-axis from those of the first vibrating region, and excitation electrodes which are provided respectively on the first vibrating region and the second vibrating region for causing the vibrating regions to vibrate independently. Frequencies that change by different amounts from each other relative to a temperature change can be retrieved from one vibrating region and the other vibrating region. Thus, based on an oscillating frequency of the vibrating region in which a clear frequency change occurs relative to the temperature, the oscillating frequency of the other vibrating region can be controlled. Thereby, increases in the complexity of the crystal oscillator can be suppressed.

9 Claims, 27 Drawing Sheets

US 8,830,004 B2

CRYSTAL RESONATOR AND CRYSTAL OSCILLATOR

CROSS-REFERENCE TO RELATED APPLICATION

This application claims the priority benefit of Japan application serial no. 2011-167028, filed on Jul. 29, 2011, and 2012-151522, filed on Jul. 5, 2012. The entirety of each of the above-mentioned patent applications is hereby incorporated by reference herein and made a part of specification.

BACKGROUND OF THE INVENTION

1. Field of the Invention

The present invention provides a crystal resonator having vibrating regions in which the positive and negative directions of the X-axis differ from each other within a surface thereof, and a crystal oscillator including the crystal resonator.

2. Description of Related Art

Crystal resonators used in electronic components such as an oscillating circuit have frequency temperature characteristics in which the oscillating frequency changes in accordance with the temperature. These frequency temperature characteristics differ in every crystal resonator depending on the cutting angle, thickness, and the like of a crystal wafer constituting the crystal resonator.

Therefore, various innovations have been devised to obtain a stable frequency output regardless of the ambient temperature. For example, the following has been proposed: constituting a first crystal resonator and a second crystal resonator by forming two groups of excitation electrodes that create a pair with each other on a common crystal wafer, calculating the difference in output between the first crystal resonator and the second crystal resonator, and utilizing this output. The first crystal resonator and the second crystal resonator constituted by a common crystal wafer as described above are affected in the same way by the surrounding temperature, and thus the influence of the surrounding temperature is minimized in the frequency output of the difference. However, calculating the difference in frequency as described above renders the constitution of the apparatus complex.

If a plurality of vibrating regions are formed on the same crystal wafer, it is necessary to constitute the crystal wafer so that the influence of one vibrating region on the other vibrating region(s) is minimized. For example, in Japanese Patent Application Laid-Open (JP-A) No. 2007-108170, a recess is formed on the crystal wafer, and the vibrating regions are partitioned from each other by the recess. However, it is difficult to solve the problem of obtaining a simple oscillating apparatus with a crystal wafer having such a constitution because the regions partitioned by the recess are both AT cut. Japanese Patent Application Laid-Open (JP-A) No. 2003-69374 discloses a technology in which a crystal wafer is twinned by irradiating a laser on the periphery of an AT-cut crystal wafer to invert the positive/negative of the crystallographic axis. However, the periphery which is irradiated by the laser is constituted as a region that supports a center portion, which is a region that is AT cut, without vibrating, and thus this technology cannot solve the above-described problem.

Some crystal oscillators are known to be used as temperature sensors using a thermistor or the like. The oscillation output is controlled based on the temperature detected by the temperature sensor, but a crystal oscillator that can achieve stable oscillation with a simpler constitution is desired.

SUMMARY OF THE INVENTION

The present invention was created in light of the above-described circumstances, and an objective thereof is to provide a crystal resonator having a plurality of vibrating regions, in which the effect of one vibrating region on the other vibrating region(s) is minimized and a crystal oscillator having a simple constitution can be constituted. A further objective is to provide a crystal oscillator in which a stable oscillation output can be achieved with a simple constitution.

The crystal resonator of the present invention comprises:
a first vibrating region provided on a crystal wafer,
a second vibrating region provided on the crystal wafer, the second vibrating region having a different thickness and positive/negative orientation of the X-axis from those of the first vibrating region, and
excitation electrodes which are provided respectively on the first vibrating region and the second vibrating region for causing the vibrating regions to vibrate independently.

Examples of specific embodiments of the crystal resonator of the present invention are explained below.

(1) In the crystal wafer, a recess is formed between the first vibrating region and the second vibrating region.

(2) One of the first vibrating region and the second vibrating region is an AT-cut region.

A crystal oscillator of the present invention is characterized in that it comprises the above-described crystal resonator. In an example of a specific embodiment of the crystal oscillator, the crystal oscillator comprises a control means that controls an oscillating frequency of the first vibrating region by controlling a control voltage for causing the first vibrating region to oscillate based on an oscillating frequency of the second vibrating region.

A crystal oscillator of the present invention comprises:
a first vibrating region provided on a crystal wafer,
a second vibrating region provided on the crystal wafer, the second vibrating region having a different thickness and positive/negative orientation of the X-axis from those of the first vibrating region,
excitation electrodes which are provided respectively on the first vibrating region and the second vibrating region for causing the vibrating regions to vibrate independently,
a first oscillating circuit for causing the first vibrating region to oscillate,
a second oscillating circuit for causing the second vibrating region to oscillate, and
a control means that estimates a temperature of the crystal wafer based on an oscillating frequency of the second vibrating region and controls an oscillating frequency from the first oscillating circuit based on the estimated temperature.

Examples of specific embodiments of the crystal oscillator of the present invention are explained below.

(3) In the crystal wafer, a filter formation region that constitutes a filter into which a signal from the first oscillating circuit is input is provided in a region different from the first vibrating region and the second vibrating region.

(4) The first vibrating region and the filter formation region are partitioned by the second vibrating region.

(5) The excitation electrodes are formed straddling the first vibrating region and the second vibrating region.

The crystal resonator of the present invention is formed such that the thicknesses of the regions that have inverted positive/negative of the X-axis and vibrate independently are different from each other. Therefore, influence from the vibration of the first vibrating region on the vibration of the second vibrating region can be minimized. Under conditions in which the vibrating regions are placed in approximately the same temperature environment, oscillating frequencies that change by different amounts from each other relative to a prescribed temperature change can be retrieved from one vibrating region and the other vibrating region. Therefore, based on an oscillating frequency of the vibrating region in which a clear frequency change occurs relative to the temperature, the oscillation of the other vibrating region can be controlled. Thereby, the difference in the oscillating frequencies of the regions does not have to be calculated, and thus increases in the complexity and cost of the constitution of a crystal oscillator constituted by the crystal resonator can be suppressed.

In the crystal oscillator of the present invention, the temperature of a crystal wafer is estimated based on the vibration of the second vibrating region provided on the crystal wafer, and the oscillating frequency by the first vibrating region in which the orientation of the positive/negative of the X-axis is inverted relative to the second vibrating region is controlled. Therefore, the cost of the apparatus can be minimized, and a stable output can be achieved.

DETAILED DESCRIPTION OF EMBODIMENTS

First Embodiment

Figure 1A:
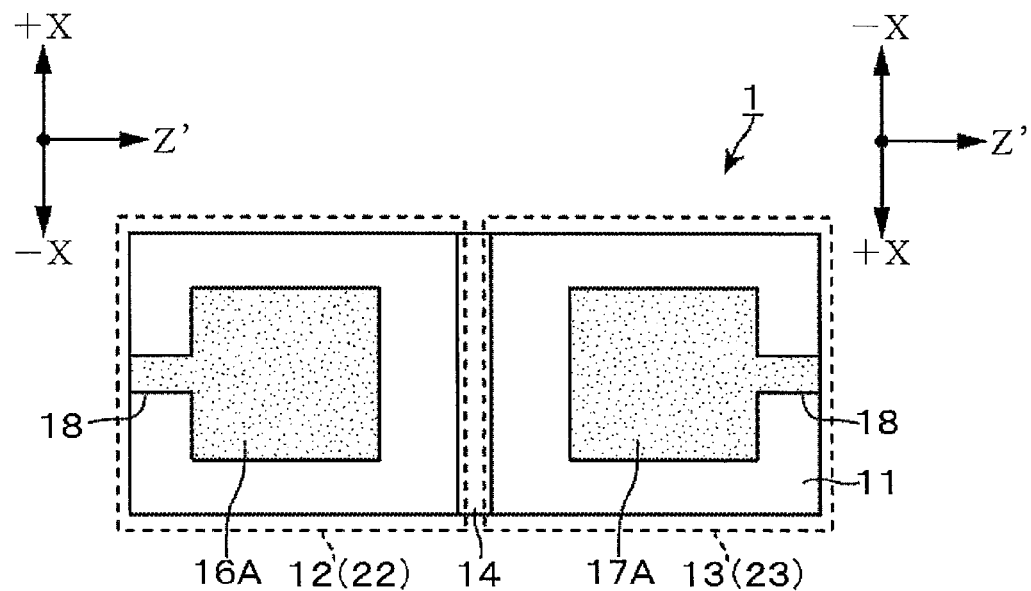
FIGS. 1A and 1B are respectively a plan view and a longitudinal side view of a crystal resonator of a first embodiment.
Figure 1B:
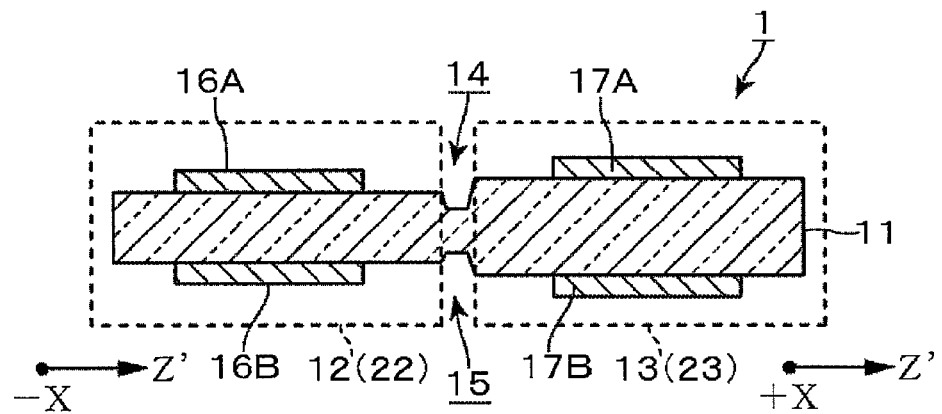

A crystal resonator according to a first embodiment of the present invention will be explained below with reference to the drawings. FIGS. 1A and 1B are respectively a plan view and a side view of the crystal resonator 1. The crystal resonator 1 includes a rectangular crystal wafer 11. A first vibrating region 12 and a second vibrating region 13 are formed respectively along the lengthwise direction of the crystal wafer 11. The top surface and underside surface of the first vibrating region 12 are parallel to the X-axis and a Z'-axis, which is inclined approximately 35° counterclockwise when viewed from the +direction of the X-axis relative to the Z-axis, which is a crystallographic axis of the crystal. In other words, the first vibrating region 12 is an AT-cut region.

The top surface and the underside surface of the second vibrating region 13 are parallel to the Z'-axis and the X-axis, and the second vibrating region 13 is constituted such that the orientation of the positive/negative of the X-axis is opposite compared to the positive/negative of the X-axis of the first vibrating region 12. In other words, the crystal wafer 11 is constituted as an electrical twin. The second vibrating region 13 is generally constituted as a DT-cut region. As shown in FIG. 1B, the first vibrating region 12 is formed with a smaller thickness than that of the second vibrating region 13.

Recesses 14 and 15 are formed respectively on the top surface and the underside surface of the crystal wafer 11 so as to partition the first vibrating region 12 and the second vibrating region 13. The recesses 14 and 15 are formed in a stripe-shape along the width direction of the crystal wafer 11, and they oppose each other. Excitation electrodes 16A and 16B for exciting the first vibrating region 12 are formed on the top and underside surfaces of the first vibrating region 12. The excitation electrodes 16A and 16B are formed to oppose each other. Similar to the first vibrating region 12, excitation electrodes 17A and 17B are provided to oppose each other on the top and underside surfaces of the second vibrating region 13. The first vibrating region 12 and the second vibrating region 13 vibrate independently of each other by the excitation electrodes 16 and 17.

Electrodes 18 are formed so as to be lead from the excitation electrodes 16 (16A and 16B) and 17 (17A and 17B) toward the ends of the crystal wafer 11. The electrodes 18 serve as conduction paths for connecting the excitation electrodes 16 and 17 to an oscillating circuit. In FIG. 1B, the leading electrodes 18 have been eliminated for convenience.

Figure 2A:
FIGS. 2A~2E are flow charts illustrating a method for producing the crystal resonator.

Next, a method for producing the above-described crystal resonator will be explained referring to FIGS. 2A~2E, which illustrates how the crystal wafer changes from a side view. FIG. 2A illustrates an AT-cut rectangular crystal wafer 21. In the state shown in FIG. 2A, the crystal wafer 21 is a solitary crystal. As an example, the dimensions of the crystal wafer 21 are length 5 mm, width 2 mm, and thickness 0.06 mM.

Figure 2B:
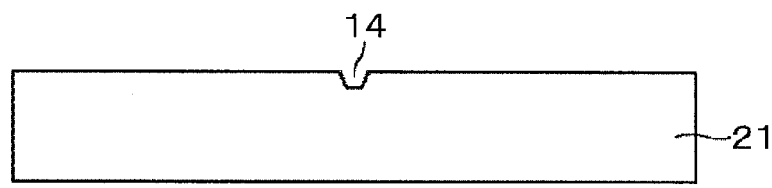

The recess 14 is formed by etching on the crystal wafer 21 to partition the crystal wafer 21 into the first vibrating region 12 and the second vibrating region 13 (FIG. 2B). Next, a carbon dioxide gas laser is irradiated on the second vibrating region 13 by a laser irradiating part (not illustrated) to heat the second vibrating region 13. The arrow marks in FIG. 2B represent the laser beam. The second vibrating region 13 is heated by the irradiation of the laser to invert the positive/negative of the X-axis of the second vibrating region 13 so that the second vibrating region 13 becomes a generally DT-cut region as described above (for convenience, the second vibrating region 13 will be described as a DT-cut region). Thereby, the crystal wafer 21 changes into the crystal wafer 11 which is a twin (FIG. 2C).

Figure 2C:
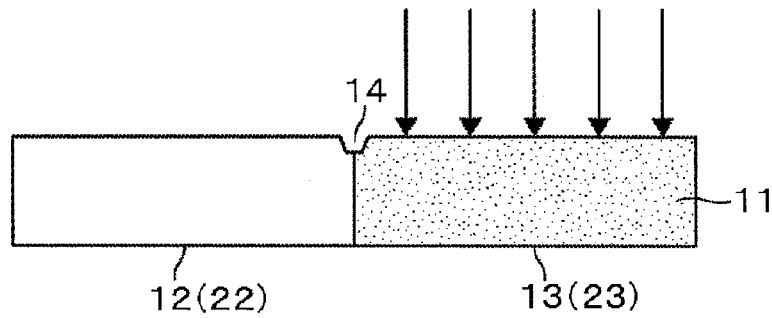
Figure 2D:
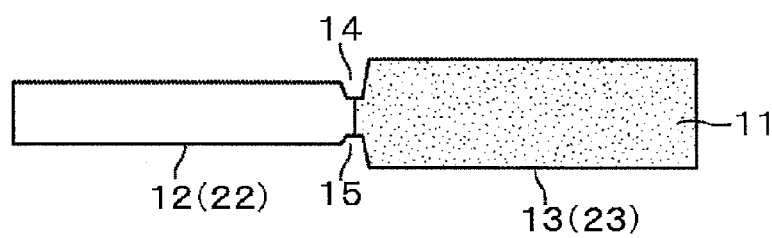
Figure 2E:
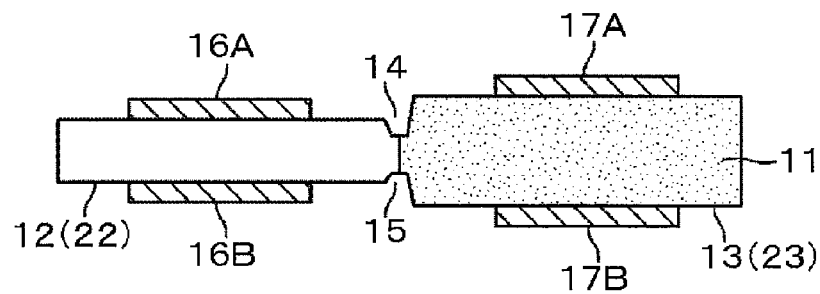

In FIGS. 2C to 2E, the region in which the crystallographic axis is inverted as described above is shaded with a plurality of dots. The inventors have confirmed by experimentation that by forming the recess 14 before irradiating the laser, the region in which the positive/negative of the X-axis is inverted is prevented from extending into the first vibrating region 12. The AT-cut region is denoted by reference numeral 22, and the DT-cut region is denoted by reference numeral 23. In the first embodiment, the AT-cut region 22 is the first vibrating region 12, and the DT-cut region 23 is the second vibrating region 13.

Next, the crystal wafer 11 is immersed in an etching solution. Due to the anisotropy of the crystal, the top and underside surfaces of the first vibrating region 12 are etched at a faster speed than the top and underside surfaces of the second vibrating region 13. Therefore, as shown in FIG. 2C, the thickness of the first vibrating region 12 becomes smaller than the thickness of the second vibrating region 13. The border portion between the first vibration region 12 and the second vibration region 13 is etched faster than the top and underside surfaces of both the first vibrating region 12 and the second vibrating region 13. Therefore, the depth of the recess 14 increases and the recess 15 is formed on the underside surface of the crystal wafer 11 (FIG. 2D). After etching the crystal wafer 11 as described above, a metal film is formed on the top surface and the underside surface of the crystal wafer 11, and the metal film is etched to form the excitation electrodes 16 and 17 and the leading electrodes 18 (FIG. 2E).

In the crystal resonator 1, the thicknesses of the first vibrating region 12, which is an AT-cut region, and the second vibrating region 13, which is a DT-cut region, are different from each other, and a step is formed between the vibrating regions 12 and 13 to minimize propagation of elastic waves from one vibrating region to the other vibrating region. Therefore, the influence of the vibration of one vibrating region on the vibration of the other vibrating region is minimized. Accordingly, when the crystal resonator 1 is incorporated into a crystal oscillator as described below, a stable output frequency can be retrieved from the vibrating regions. Further, in the crystal resonator 1, recesses 14 and 15 are formed. The propagation of elastic waves is further suppressed by the recesses 14 and 15, and thus the influence of the vibration of one vibrating region on the vibration of the other vibrating region is reliably suppressed.

Figure 3A:
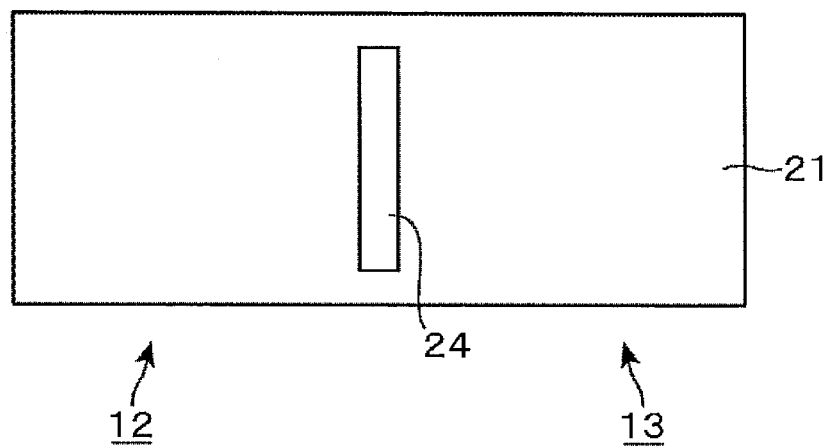
FIGS. 3A and 3B are an explanatory view illustrating another method for producing the crystal resonator.
Figure 3B:
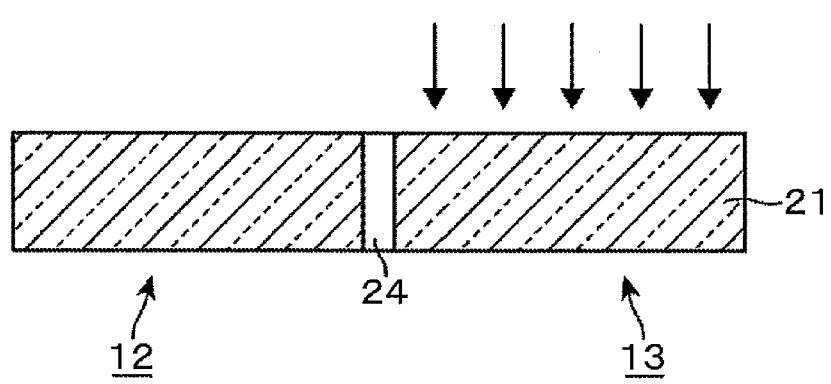

FIGS. 3A and 3B are respectively a plan view and a longitudinal side view of the crystal wafer 21. In the above-described example, when irradiating the laser to form a twin, the recess 14 is formed on the crystal wafer 21. However, the recess 14 also includes a through-hole 24 as shown in FIGS. 3A and 3B. The through-hole 24 is formed linearly in the width direction of the crystal wafer 21. The inventors have confirmed that inversion of the positive/negative of the X-axis occurs in the second vibrating region 13 and inversion of the positive/negative of the X-axis does not occur in the first vibrating region 12 even if the second vibrating region 13 is irradiated by the laser upon forming the through-hole 24 as described above. In other words, the size of the region in which the positive/negative of the X-axis is inverted can be controlled with high precision by forming the recess in the crystal wafer to partition the vibrating regions. The present embodiment is not limited to inverting the positive/negative of the X-axis by irradiating a laser as described above, and for example, the crystal wafer can be covered with a metal film and then heated to invert the positive/negative of the X-axis in the area covered by the metal film.

TCXO of the First Embodiment

Next, a temperature compensated crystal oscillator (TCXO) constituted using the crystal resonator 1 described above will be explained referring to the circuit constitution diagram of FIG. 4. The crystal resonator 1 includes two vibrating regions that vibrate independently as explained above. Thus, for convenience of explanation, the crystal resonator 1 will be regarded in the following explanation as two crystal resonators: the crystal resonator including the first vibrating region 12 (AT-cut region 22) will be referred to as 1A, and the crystal resonator including the second vibrating region 13 (DT-cut region 23) will be referred to as 1B.

Figure 4:
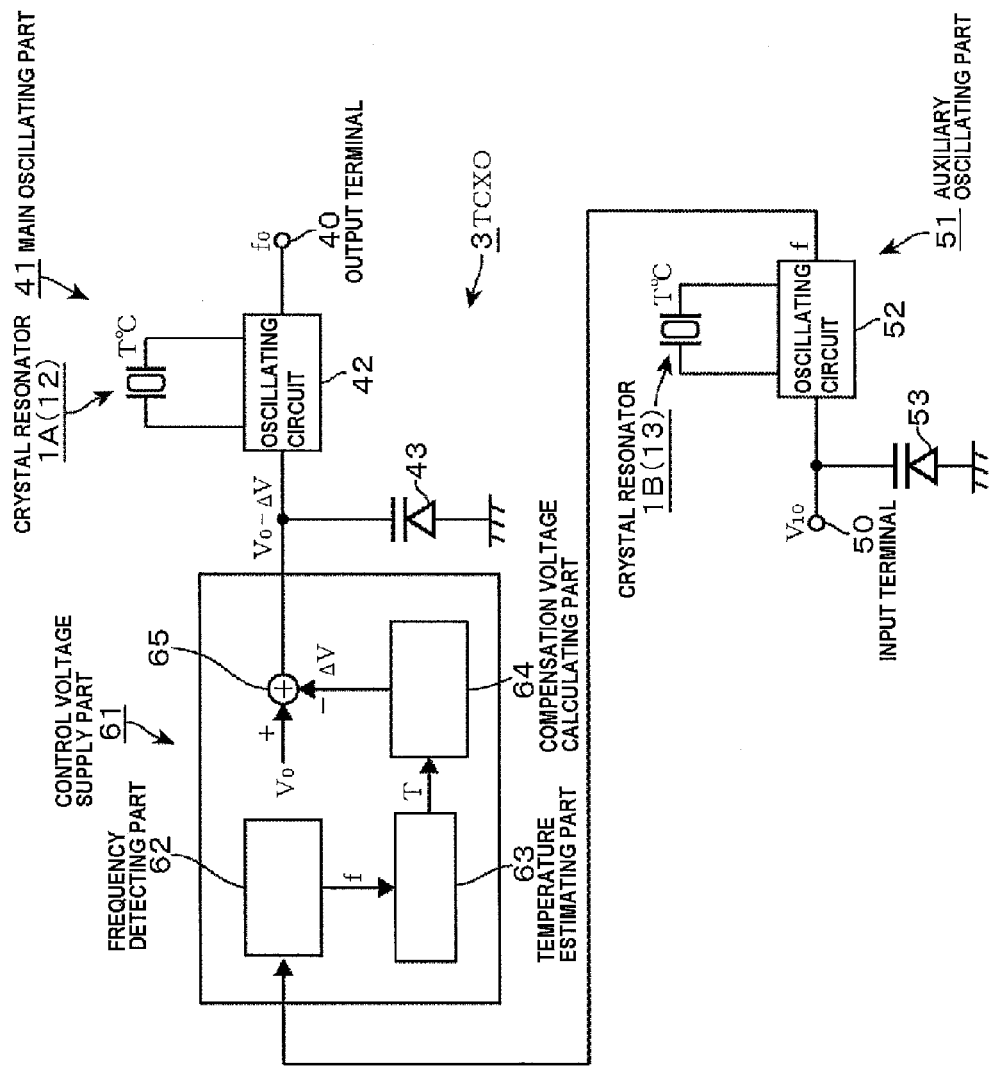
FIG. 4 is a circuit diagram of a temperature compensated oscillator comprising the crystal resonator of the first embodiment.

The TCXO 3 includes a main oscillating part 41 for outputting a signal of a set frequency $f_0$ to the outside, an auxiliary oscillating part 51 for causing the signal for temperature compensation to oscillate, and a control voltage supply part 61 provided between the main oscillating part 41 and the auxiliary oscillating part 51 for calculating a control voltage $V_c$ input to the main oscillating part 41 based on the signal for temperature compensation output from the auxiliary oscillating part 51. 50 in FIG. 4 denotes an input terminal of a control voltage $V_{10}$ of the auxiliary oscillating part 51, and 40 denotes an output terminal of the TCXO 3.

The main oscillating part 41 includes the crystal resonator 1A and a main oscillating circuit 42 connected to the crystal resonator 1A. The auxiliary oscillating part 51 includes the crystal resonator 1B and an auxiliary oscillating circuit 52 connected to the crystal resonator 1B. The control voltage supply part 61 mentioned above is connected to the front-stage side (input side) of the main oscillating part 41, and the control voltage $V_c$ is applied from the control voltage supply part 61 to the main oscillating part 41 via a varicap diode 43. The control voltage supply part 61 subtracts a temperature compensation voltage $\Delta V$ from a reference voltage $V_0$ of the main oscillating part 41 (can also be regarded as an addition depending on the sign of $\Delta V$) as shown by formula (1), and thereby the control voltage $V_c$ is generated.

$$V_c = V_0 - \Delta V \tag{1}$$

The reference voltage $V_0$ is a control voltage when the set frequency $f_0$ is output from the main oscillating part 41 at a reference temperature $T_0$, such as 29° C. The temperature compensation voltage $\Delta V$ is represented as shown below. Basically, since the control voltage V and the oscillating frequency f are in a proportional relationship, $\Delta V$ is represented by formula (2). If the oscillation is in a thickness-shear vibration mode using an AT-cut crystal wafer, the relationship in formula (3) is established, and thus $\Delta V$ is represented by formula (4). T is a temperature, $\Delta f = f - f_0$, detected in a temperature estimating part 63 to be explained below. $\alpha_1$, $\beta_1$, and $\gamma_1$ are constants that are intrinsic to the main oscillating part 41.

$$\Delta V = V_0(\Delta f/f_0) \tag{2}$$

$$\Delta f/f_0 = \alpha_1(T-T_0)^3 + \beta_1(T-T_0) + \gamma_1 \tag{3}$$

$$\Delta V = V_0\{\alpha_1(T-T_0)^3 + \beta_1(T-T_0) + \gamma_1\} \tag{4}$$

$V_{10}$ is a control voltage applied from the input terminal 50 to the DT-cut region 23 via a varicap diode 53. The control voltage supply part 61 includes a frequency detecting part 62 consisting of, for example, a frequency counter or the like for measuring the oscillating frequency f from a frequency signal input from the auxiliary oscillating part 51, a temperature estimating part 63 that estimates the temperature T based on the oscillating frequency f measured by the frequency detecting part 62, a compensation voltage calculating part 64 for calculating the above-mentioned compensation voltage $\Delta V$ based on the temperature T estimated by the temperature estimating part 63, and an adding part 65 for outputting to the main oscillating part 41 the control voltage $V_c$ found by subtracting the compensation voltage $\Delta V$ calculated in the compensation voltage calculating part 64 from the reference voltage $V_0$. Depending on whether the sign of the compensation voltage $\Delta V$ is determined to be positive or negative, the calculation in the adding part 65 is $(V_0-\Delta V)$ or $(V_0+\Delta V)$. However, in this embodiment, the $\Delta V$ as found in the above formula (4) will be treated as the compensation voltage, and thus it will be expressed as $(V_0-\Delta V)$. In other words, calculation should be carried out so that $V_0$ is compensated by $\Delta V$ by only the amount that the oscillating frequency f varies from the set frequency $f_0$ in accordance with the frequency temperature characteristics.

The frequency temperature characteristics of the auxiliary oscillating part 51 are stored in the temperature estimating part 63, and the temperature T around the TCXO 3 is calculated based on the temperature characteristics and the oscillating frequency f of the auxiliary oscillating part 51 ($f_0$ and $T_0$ are preset). The compensation voltage calculating part 64 includes a cubic function generator that is, for example, the temperature characteristics of the main oscillating part 41, and the compensation voltage $\Delta V$ is found by the above-described formula (4) and the temperature T.

Figure 5:
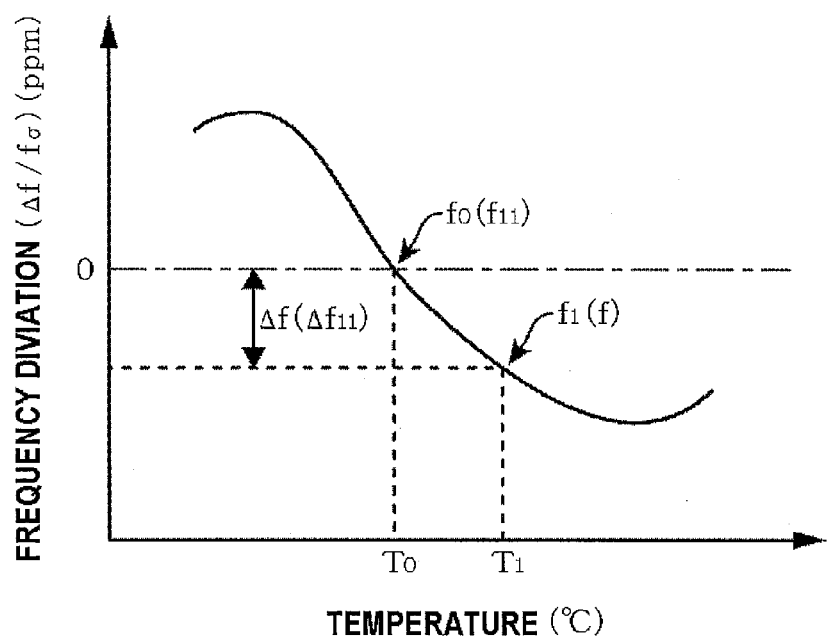
FIG. 5 is a graph illustrating the temperature characteristics of an AT-cut region that forms the crystal wafer.

Next, the operation of the TCXO 3 will be explained. In the main oscillating part 41, a voltage $V_c$ found by subtracting a temperature compensation voltage $\Delta V$ to be explained below from the reference voltage $V_0$ when the set frequency $f_0$ is output at the reference temperature $T_0$, such as 29° C., is supplied to the main oscillating circuit 42 via the varicap diode 43, and the main oscillating circuit 42 oscillates at the frequency f. At this time, the crystal resonator 1A is at, for example, a temperature $T_1$ ($T_1 > T_0$), and if the control voltage V is the reference voltage $V_0$, the frequency f that oscillates in the main oscillating part 41 as shown in FIG. 5 is about to deviate from the set frequency $f_0$ corresponding to the reference temperature $T_0$ to a frequency $f_1$ corresponding to a temperature $T_1$ along a cubic curve, which is a temperature characteristics curve. However, the control voltage $V_c$ supplied to the main oscillating part 41 as described above becomes a value in which the reference voltage $V_0$ is compensated by the temperature compensation voltage $\Delta V$, and thus the set frequency $f_0$ is output from the output terminal 40. The temperature compensation voltage $\Delta V$ is calculated in the control voltage supply part 61 as explained below.

Figure 6:
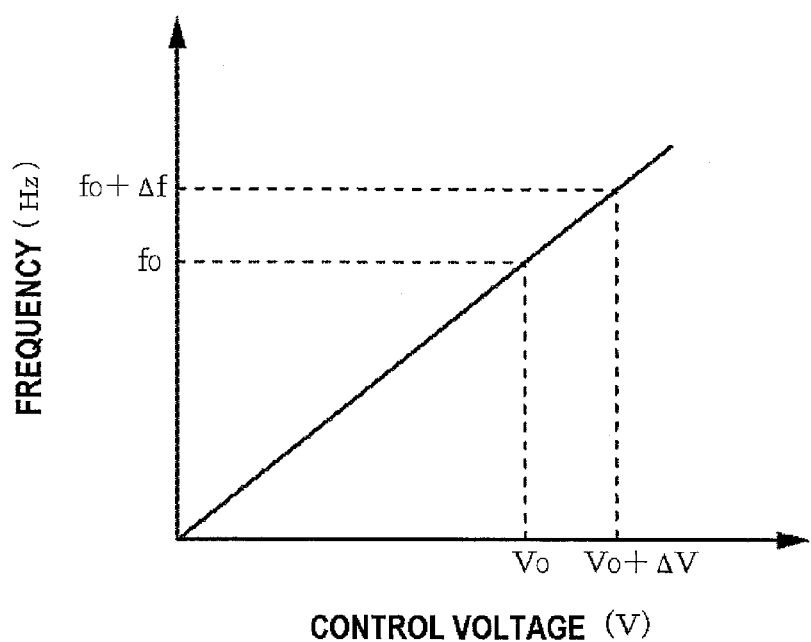
FIG. 6 is a graph illustrating the relationship between the control voltage and the oscillating frequency.

As described above, the oscillating frequency f in the main oscillating part 41 is proportional to the control voltage V as shown in FIG. 6. Therefore, in the control voltage supply part 61, control is performed so that the control voltage V is increased by the compensation voltage $\Delta V$ corresponding to $\Delta f$, which is the difference between the frequency $f_1$ and the set frequency $f_0$, in order to compensate $\Delta f$. The compensation voltage $\Delta V$ is found by substituting the temperature $T_1$ for the temperature T in the above formula (4).

The temperature $T_1$ is calculated based on the oscillating frequency f of the auxiliary oscillating part 51 as described below. By inputting the control voltage $V_{10}$ into the input terminal 50, the auxiliary oscillating part 51 oscillates. Below, $T_{10}$ is the reference temperature, for example 29° C., and $f_{10}$ is a frequency obtained when the reference voltage $V_{10}$ is supplied to the auxiliary oscillating circuit 52 as a control voltage.

Figure 7:
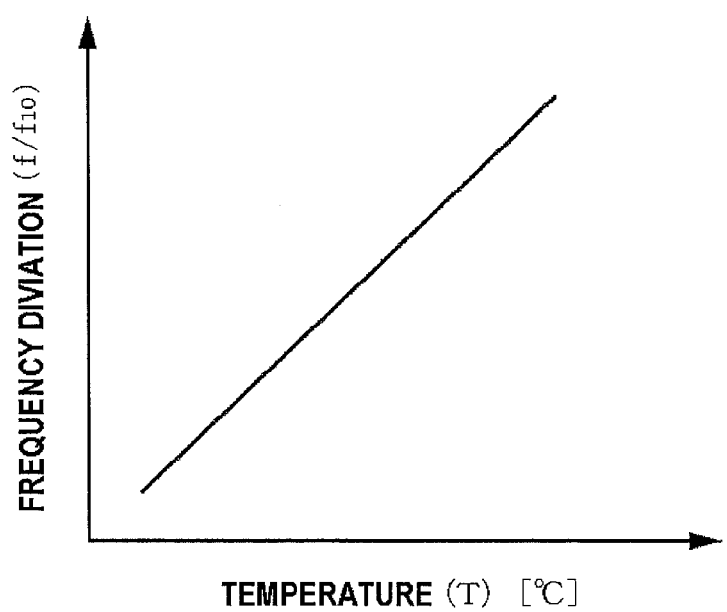
FIG. 7 is a graph illustrating the temperature characteristics of one region forming the crystal wafer.

The oscillation in the auxiliary oscillating part 51 is the oscillation of the DT-cut region 23 (the crystal resonator 1B) explained above. In the crystal wafer that is DT cut, it is known that the relationship between the temperature T and the frequency deviation (frequency change rate) $f/f_{10}$ approximates a quadratic function. However, in the range in which the TCXO 3 is normally used, for example 0° to 30° C., it is roughly a proportional relationship as shown in FIG. 7, and the relationship of formula (5) is established between the temperature T and the oscillating frequency f from the auxiliary oscillating part 51.

$$f = f_{10}\{\alpha_2(T-T_{10}) + \beta_2\} \tag{5}$$

The frequency detecting part 62 estimates the temperature T using the oscillating frequency f and the formula (5). The temperature T and the oscillating frequency f are in a proportional relationship as described above, and the frequency f clearly changes relative to the temperature T. Further, since the oscillating frequency f changes relatively sharply relative to the change in the temperature T, the temperature change can be detected with high sensitivity in the TCXO 3. $\alpha_2$ and $\beta_2$ are preset constants intrinsic to the auxiliary oscillating part 51, and differ in the control voltage V of various values. Therefore, the control voltage V input to the input terminal 50 is the same voltage, for example $V_{10}$, as when these constants were calculated.

The compensation voltage calculating part 64 calculates the compensation voltage $\Delta V$ based on the temperature T as found above and formula (5) described above. Thereby, in order to overcome an action in which the oscillating frequency f of the main oscillating part 41 is about to increase by only $\Delta f$ and the oscillating frequency f is about to decrease by only $\Delta f$ because the temperature is temperature T, the oscillating frequency f output from the output terminal 40 is maintained at the set frequency $f_0$.

In the TCXO 3, by using the crystal resonator 1 described above, a stable output from the main oscillating part 41 and the auxiliary oscillating part 51 can be obtained, and the output of the main oscillating part 41 can be controlled by using the output from the auxiliary oscillating part 51 as a control voltage. Thereby, a stable output can be obtained without calculating the difference in the outputs of each crystal resonator 1A and 1B, and thus increases in the size of the apparatus and increases in the production costs can be minimized.

Second Embodiment

Figure 8A:
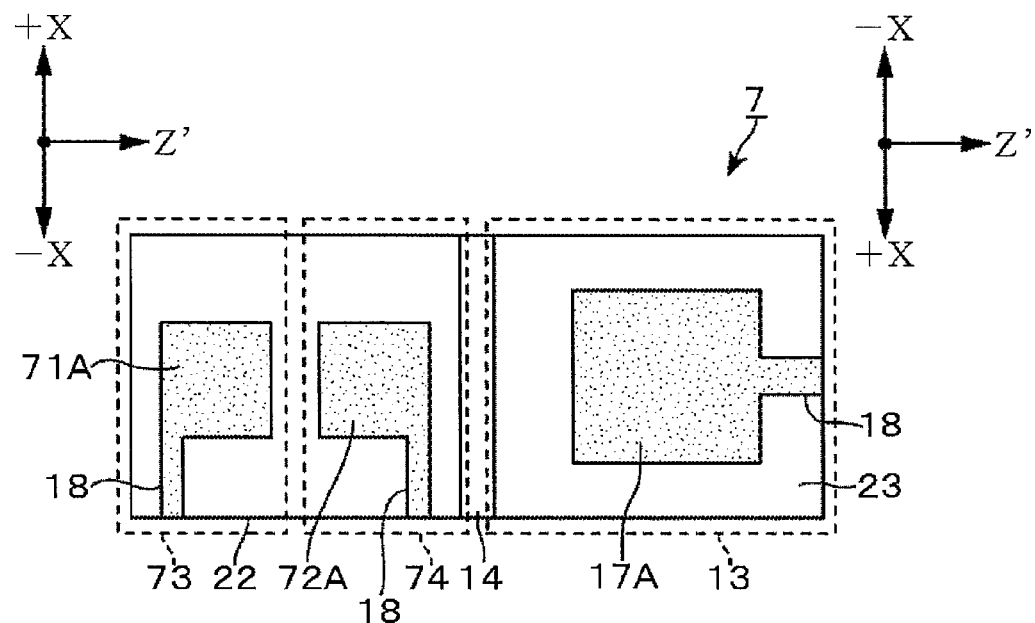
FIGS. 8A and 8B are respectively a plan view and a longitudinal side view of a crystal resonator of a second embodiment.
Figure 8B:
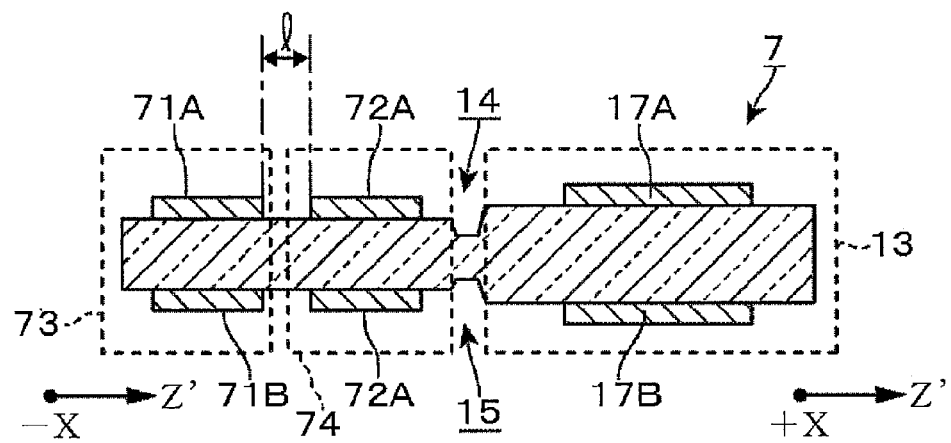

Next, another TCXO 70 will be explained. FIGS. 8A and 8B are a plan view and a longitudinal side view of a crystal resonator 7 used in the TCXO 70. The crystal resonator 7 consists of an AT-cut region 22 and a DT-cut region 23 like the crystal resonator 1. However, excitation electrodes 71A and 71B and excitation electrodes 72A and 72B are formed in the AT-cut region 22, and the peripheries of the excitation electrodes 71 (71A and 71B) and 72 (72A and 72B) vibrate independently. The region that vibrates by the excitation electrodes 71 is denoted as 73, and the region that vibrates by the excitation electrodes 72 is denoted as 74. A dimension l between the excitation electrodes 71 and 72 is set to, for example, 1 mm so that the influence of the vibration of the vibrating region 73 on the vibration of the vibrating region 74 is minimized. The thicknesses of the excitation electrodes 71 and 72 are different than each other in order to slightly displace the frequencies output from the vibrating regions 73 and 74.

Figure 9:
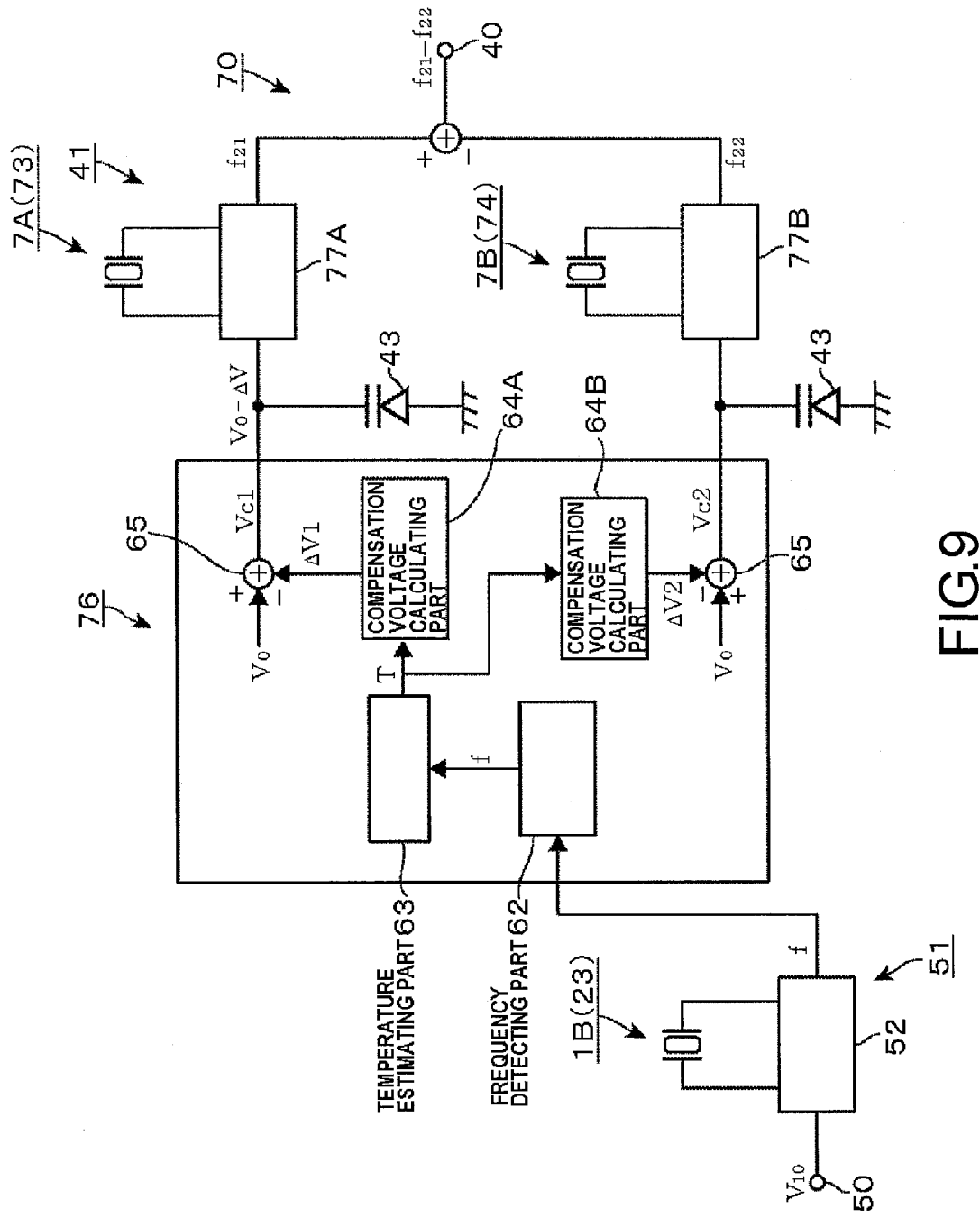
FIG. 9 is a circuit diagram of a temperature compensated oscillator comprising the crystal resonator of the second embodiment.

FIG. 9 is a circuit diagram of the TCXO 70. The crystal resonator 7 will be explained below as including three crystal resonators for the sake of convenience because the vibrating regions vibrate independently. The crystal resonator constituted by the vibrating region 73 will be denoted as 7A, and the crystal resonator constituted by the vibrating region 74 will be denoted as 7B. The crystal resonator constituted by the vibrating region 13 will be denoted as 1B as in the TCXO 3. In the TCXO 70, a difference $f_{21}-f_{22}$ is found between the output ($f_{21}$) from the crystal resonator 7A and the output ($f_{22}$) from the crystal resonator 7B. Since the crystal resonators 7A and 7B are constituted by the same crystal wafer 11, they are placed in nearly identical temperature environments. However, since the temperature differs slightly due to differences in the positions of the crystal resonators 7A and 7B, $f_{21}-f_{22}$ varies slightly with respect to changes in the surrounding temperature. An objective of the TCXO 70 is to further minimize such variations.

In this example, similar to the TCXO 3, a surrounding temperature T of the crystal resonators is detected based on the output of the crystal resonator 1B, and ΔV is calculated by formula (4) by compensation voltage calculating parts 64A and 64B provided respectively to the crystal resonators 7A and 7B in accordance with the temperature T. In formula (4), the constants $\alpha_1$, $\beta_1$, and $\gamma_1$ used in the compensation voltage calculating parts 64A and 64B are values intrinsic to the crystal resonators 7A and 7B.

In the TCXO 70, portions that are constituted in the same manner as explained above for the TCXO 3 are denoted with the same reference numerals, and explanations thereof are omitted. A control voltage supply part 76 of the TCXO 70 is a location that corresponds to the control voltage supply part 61 of the TCXO 3, and it includes the compensation voltage calculating parts 64A and 64B as described above. A signal is output from the temperature estimating part 63.

In the compensation voltage calculating parts 64A and 64B, ΔV is calculated by formula (4) in the same way as in the compensation voltage calculating part of the TCXO 3, but ΔV is calculated using the respective intrinsic constants $\alpha_1$, $\beta_1$, and $\gamma_1$ that are respectively set in accordance with each of the crystal resonators 7A and 7B.

The compensation voltage calculating parts 64A and 64B are connected to adding parts 65 provided in the crystal resonators 7A and 7B, and a control voltage $V_c$ is calculated in each adding part 65. The control voltages $V_c$ are output to oscillating circuits 77A and 77B respectively connected to the crystal resonators 7A and 7B via varicap diodes 43, and $f_{21}$ and $f_{22}$ are controlled so that they become stable outputs. In the drawings, the ΔVs output from the compensation voltage calculating parts 64A and 64B are denoted as ΔV1 and ΔV2, and the control voltages $V_c$ applied to the oscillating circuits 77A and 77B are denoted as $V_c1$ and $V_c2$. $V_c1=V_0-\Delta V1$ and $V_c2=V_0-\Delta V2$.

An adding part 77 is provided to the back stage of the oscillating circuits 77A and 77B, and the difference $f_{21}-f_{22}$ between the output $f_{21}$ of the crystal resonator 7A and the output $f_{22}$ of the crystal resonator 7B is calculated and output to the output terminal 40. In this example, the separation between the vibration of the vibrating regions 73 and 74 and the vibration of the vibrating region 13 is high, and each vibrating region vibrates stably. $f_{21}$ and $f_{22}$ are controlled based on the oscillating frequency f of the vibrating region 13 so that their influence on the respective temperatures is minimized, and the amount of change of the crystal resonators due to temperature is cancelled by calculating the difference between $f_{21}$ and $f_{22}$. Therefore, an output with higher stability can be obtained from the TCXO 70.

Third Embodiment

Figure 10:
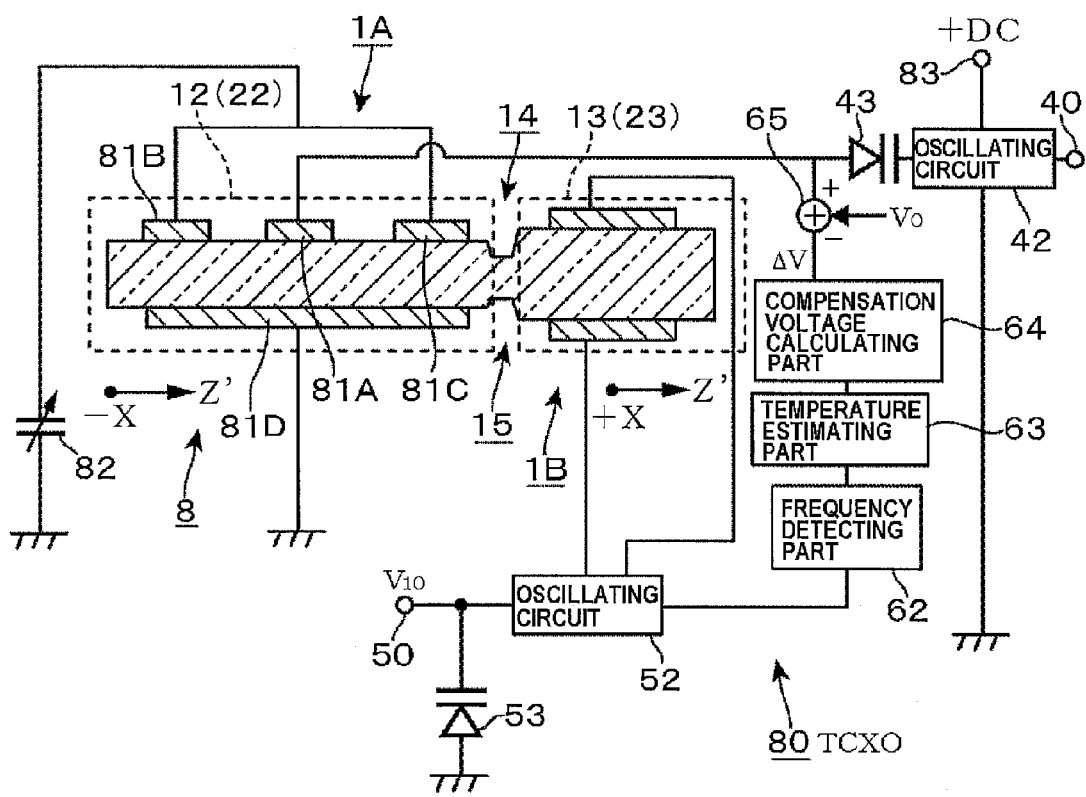
FIG. 10 is a constitutional view of a temperature compensated oscillator comprising a crystal resonator of a third embodiment.

The TCXO can also be constituted like a TCXO 80 shown in FIG. 10. A crystal resonator 8 used in the TCXO 80 will be explained focusing on the points of difference from the crystal resonators 1 and 7. In this example, similar to the first embodiment, the first vibrating region 12 is the AT-cut region 22, and the second vibrating region 13 is the DT-cut region 23. On the top surface of the AT-cut region 22, an excitation electrode 81A and excitation electrodes 81B and 81C which sandwich the excitation electrode 81A are provided. The electrodes 81A to 81C are arranged in the Z'-axis direction. The electrodes 81B and 81C are connected to each other by a conduction path, and are constituted at the same potential. On the underside surface of the AT-cut region 22, an excitation electrode 81D that is grounded so as to oppose the excitation electrodes 81A, 81B, and 81C is provided. By configuring this kind of electrode arrangement, the electric charge distribution of the top and underside surfaces of the AT-cut region 22 is controlled, and noise in the output signal is suppressed. The excitation electrode 81D can be divided into separate electrodes that oppose the electrodes 81A to 81C.

The electrodes 81B and 81C are connected to a grounded variable capacitor 82. The capacity of the variable capacitor 82 is adjusted to match the set frequency $f_0$ at the reference temperature $T_0$ to a desired value. In a TCXO, the frequency characteristics relative to the temperature vary due to aging, and such variations also similarly occur in the TCXO 80. However, by providing electrodes on the top and underside surfaces of the crystal wafer, connecting one group of the electrodes to an oscillating circuit, and connecting the other group of electrodes to an element that can adjust the oscillating frequency such as the variable capacitor as in the TCXO 80, when changes in the frequency characteristics relative to the temperature are represented on a graph, variations in the graph such that it rotates around the set frequency $f_0$ at the reference temperature $T_0$ are suppressed. Further, the graph varies such that the frequency deviates towards higher or lower in a state in which the shape of the graph is maintained due to aging and changes in the capacity of the variable capacitor 82 and the like. In other words, it is not necessary to reset the constants $\alpha_1$, $\beta_1$, and $\gamma_1$ in formula (4) in response to variations in the frequency characteristics due to aging, and it is sufficient to adjust the set frequency $f_0$ by the variable capacitor 82 as described above. Therefore, in the TCXO 80, corrections can easily be carried out in response to variations in the frequency characteristics due to aging.

In the TCXO 80, similar to the TCXOs explained above, the control voltage ΔV is output from the compensation voltage calculating part 64 in accordance with the temperature, a voltage corresponding to the control voltage ΔV, for example $V_0 - \Delta V$ as in the first embodiment, is output from the adding part 65 and applied to the varicap diode 43, and thereby the capacity of the varicap diode 43 changes. Thereby, the output from the main oscillating circuit 42 is maintained at the set frequency $f_0$. In the drawings, 83 denotes a voltage supply terminal of the main oscillating circuit 42. In the TCXO 80, similar to the first embodiment, since stable output can be obtained from the vibrating regions, the output of the TCXO 80 can be stabilized.

In the above-described embodiments, the crystal wafer was constituted by an AT-cut region and a DT-cut region. However, as long as the positive/negative of the X-axis is inverted, for example, a Y-cut region can be used instead of a DT-cut region. Further, a BT-cut region can be used instead of an AT-cut region. In addition, instead of modifying the polarity of a prescribed region of the crystal wafer by thermal processing, crystal wafers having different polarities can be bonded by siloxane bonding or the like to form a twin.

Fourth Embodiment

Figure 11:
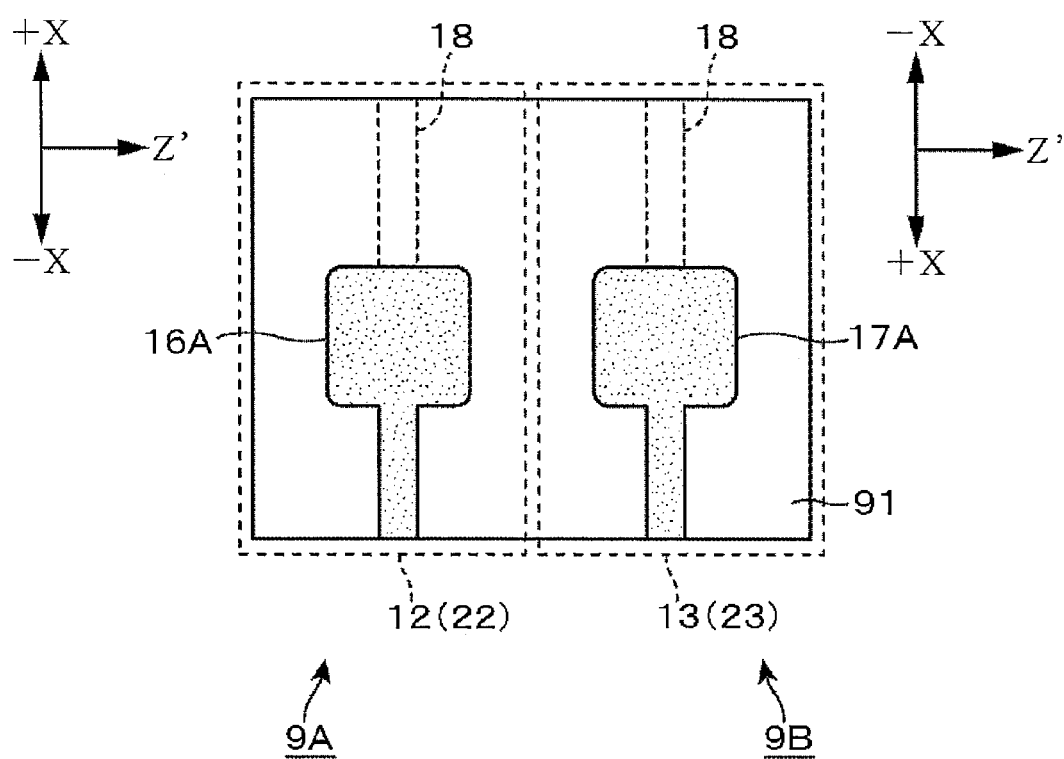
FIG. 11 is a plan view of a crystal resonator that constitutes a crystal oscillator of a fourth embodiment.
Figure 12:
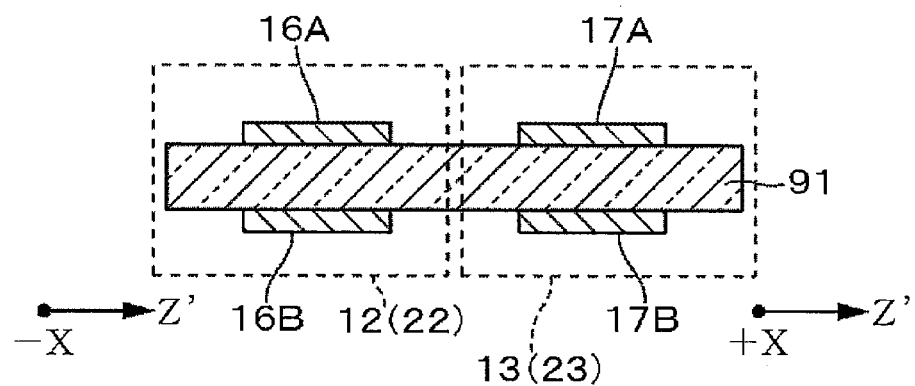
FIG. 12 is a longitudinal side view of the crystal resonator of the fourth embodiment.

A fourth embodiment will now be explained. The fourth embodiment is an alternative embodiment of the TCXO 3 of the first embodiment, and is identical to the TCXO 3 of the first embodiment except that the constitution of the crystal resonators is different. FIGS. 11 and 12 respectively illustrate a top surface and a longitudinal side surface of crystal resonators 9A and 9B. Portions that are constituted in the same manner as explained above for the first embodiment are denoted with the same reference numerals, and explanations thereof are omitted. A point of difference from the crystal resonators 1A and 1B is that a crystal wafer 91 is used instead of the crystal wafer 21. In the crystal wafer 91, the first vibrating region 12 which is an AT-cut region and the second vibrating region 13 in which the positive/negative of the X-axis is inverted relative to the AT-cut region are formed to have the same thickness as each other. The crystal resonators 9A and 9B are respectively constituted by the vibrating regions 12 and 13. In the crystal wafer 91, recesses 14 and 15 are not formed between the vibrating regions 12 and 13.

The crystal wafer 91 is produced so that it has the vibrating regions 12 and 13 as described above by, for example, subjecting a portion of the AT-cut crystal wafer 11 to heat of approximately 600° C. to invert the positive/negative of the crystallographic axis. In the TCXO 3 shown in FIG. 4, the crystal resonator 9A is used instead of 1A and the crystal resonator 9B is used instead of 1B to constitute the TCXO 3. The effects described above can still be achieved by constituting the TCXO 3 in this way.

In the TCXO 3, an oscillation output of the auxiliary oscillating part 51 using the crystal resonator 9B is made into a temperature sensor. Instead of using the auxiliary oscillating part 51 in this way as a temperature sensor, it is also possible to use a temperature compensation circuit including a thermistor. In other words, in the TCXO 3, the temperature compensation circuit is provided instead of the auxiliary oscillating part 51. Thus, it is conceivable to constitute a TCXO in which the output from the temperature compensation circuit changes due to changes in the resistance value of the thermistor due to temperature changes, and thereby the capacitance component of the varicap diode 43 is adjusted and a compensation voltage is calculated. The advantages of the TCXO 3 over this kind of TCXO (referred to as a "reference TCXO") will be explained below.

If the temperature compensation circuit is used, the temperature compensation circuit is provided in a location that is separated from the crystal resonator 1A for retrieving an oscillation output of the reference TCXO. Therefore, there are cases in which the detected temperature of the thermistor deviates relative to the temperature of the crystal resonator 1A, or the change in output of the temperature compensation circuit is delayed relative to the temperature change of the crystal resonator 1A. Thus, the stability of the output of the reference TCXO may drop. However, in the TCXO 3 as described above, the temperature sensor is formed using the crystal wafer 91, which is the same as the crystal wafer 91 that constitutes the crystal resonator 9A. In other words, the crystal resonator 9B that constitutes the temperature sensor is adjacent to the crystal resonator 9A, and thus the output of the crystal resonator 9B follows the temperature change of the crystal resonator 9A with high accuracy, and deviations of the actual temperature of the crystal resonator 9A from the temperature detected by the temperature sensor and delays in the output change of the auxiliary oscillating part 51 relative to the temperature change of the crystal resonator 9A are minimized. Therefore, the oscillation output of the crystal resonator 9A can be controlled with high accuracy, and drops in the stability of the oscillation output can be suppressed.

In the TCXO 3, the resolution of the output relative to the temperature of the oscillating circuit 52 to which the crystal resonator 9B is connected is, for example, $1/10^{9}$° C. or greater. In other words, the output frequency of the oscillating circuit 52 varies due to temperature changes of $10^{-9}$° C. or less. In contrast, the temperature compensation circuit using the thermistor described above can change the output due to temperature changes on the level of $10^{-6}$° C., but it is technically difficult to achieve a higher resolution with such a temperature compensation circuit. Basically, the resolution of the output of the oscillating circuit 52 can be increased higher than the resolution of the output of the temperature compensation circuit, and thus the stability of the output can be increased in the TCXO 3 more than in the reference TCXO.

Since the TCXO 3 is constituted by the crystal resonators 9A and 9B which are formed from the common crystal wafer 91, the number of parts of the apparatus can be decreased and the size of the apparatus can be reduced. Further, increases in the production costs can also be suppressed. Even when compared to an MCXO (microcomputer compensated crystal oscillator), the TCXO 3 has an advantage in that increases in the size, increases in the number of parts, and increases in the complexity of the circuit can be prevented.

The above-described crystal wafer 91 was formed from the AT-cut crystal wafer 11 that is rectangular shaped, one side thereof being 2.0 mm and the other side being 5.0 mm, and has a nominal frequency (center frequency indicated by the manufacturer) of 38.4 MHz, and the crystal resonators 9A and 9B were prepared from the above crystal wafer 91. The oscillating frequency constant of the crystal resonator 9A was approximately 63% of the oscillating frequency constant of the crystal resonator 9B, and it was confirmed that elastic bonding of the vibrating regions 12 and 13 to each other was small. The thickness of the second vibrating region 13 in which the positive/negative of the crystallographic axis is inverted does not differ from that of the first vibrating region 12 due to the inversion of the positive/negative of the crystallographic axis, but the elastic constant of the second vibrating region 13 changes. Since the elastic constants of the vibrating regions 12 and 13 differ from each other, it was predicted that their thermal reaction rates, which is the time (reaction speed) until the frequency changes after a temperature change, would also differ. However, in the results of experimentation, no difference in the reaction rates was detected, and it was confirmed that any differences were so small that they could be ignored. In other words, these results also show that the frequency can be controlled with high accuracy relative to the temperature in the TCXO 3. By inverting the positive/negative of the crystallographic axis, the frequency temperature characteristics of the vibrating region changes. The vibrating region 13 has temperature characteristics in which the output frequency changes by 30 ppm for each 1° C. change in the temperature.

Figure 13:
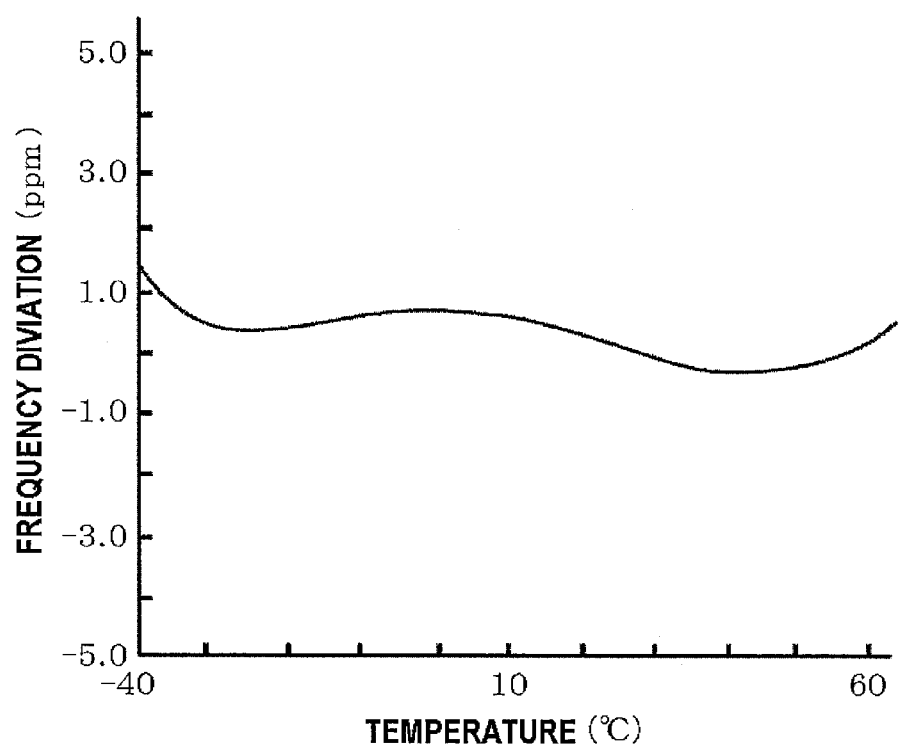
FIG. 13 is a graph illustrating the temperature characteristics of a TCXO, which is a comparative example.
Figure 14:
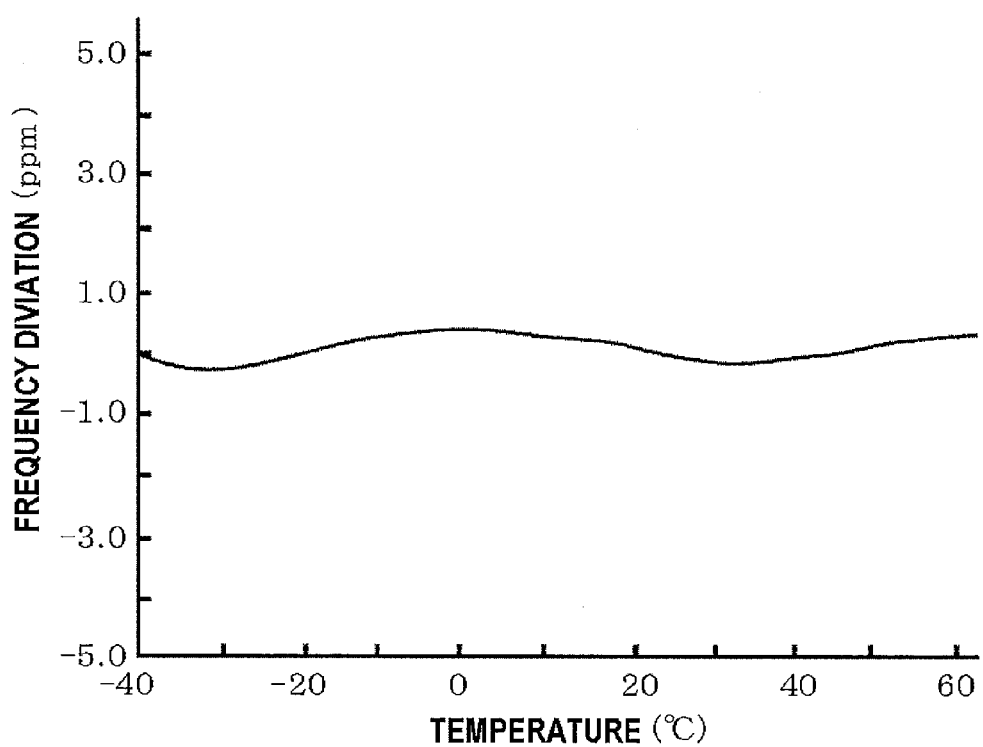
FIG. 14 is a graph illustrating the temperature characteristics of the TCXO of the fourth embodiment.

FIG. 13 is a graph of the temperature characteristics of the reference TCXO, and FIG. 14 is a graph of the temperature characteristics of the TCXO 3. In both graphs, the horizontal axis is the temperature (units: ° C.) surrounding the TCXO, and the vertical axis is the frequency deviation (units: ppm). Variations in the frequency deviation due to temperature are more suppressed in the TCXO 3.

Fifth Embodiment

Figure 15:
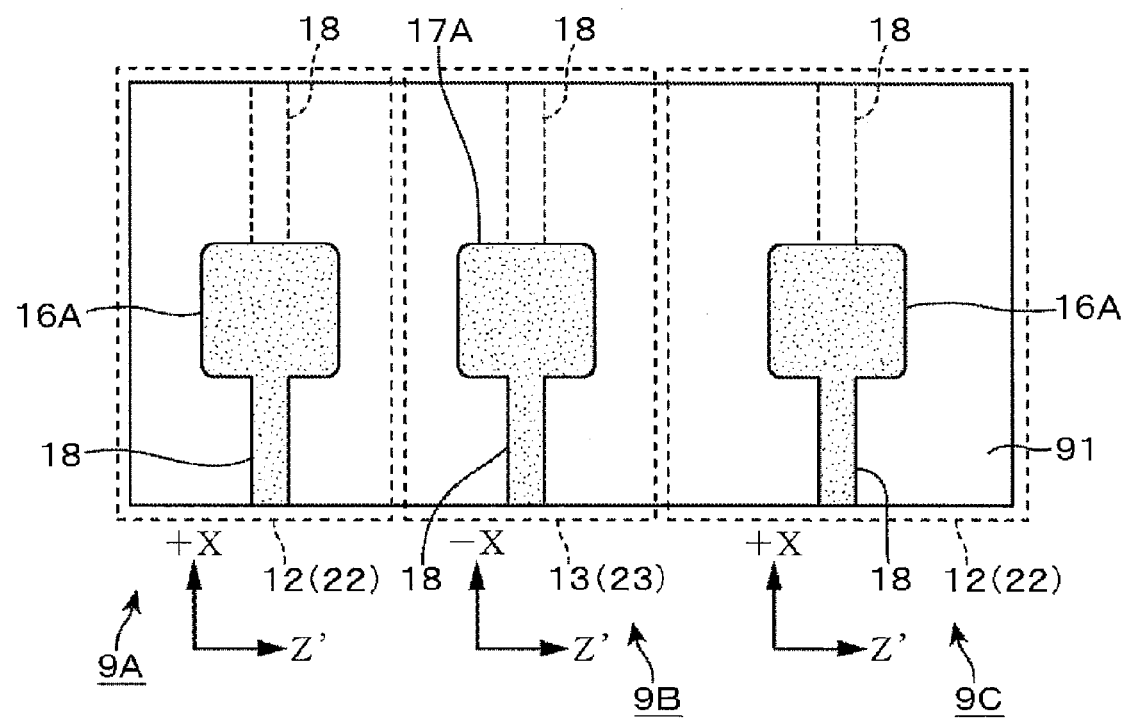
FIG. 15 is a plan view of a crystal resonator that constitutes a TCXO of a fifth embodiment.
Figure 16:
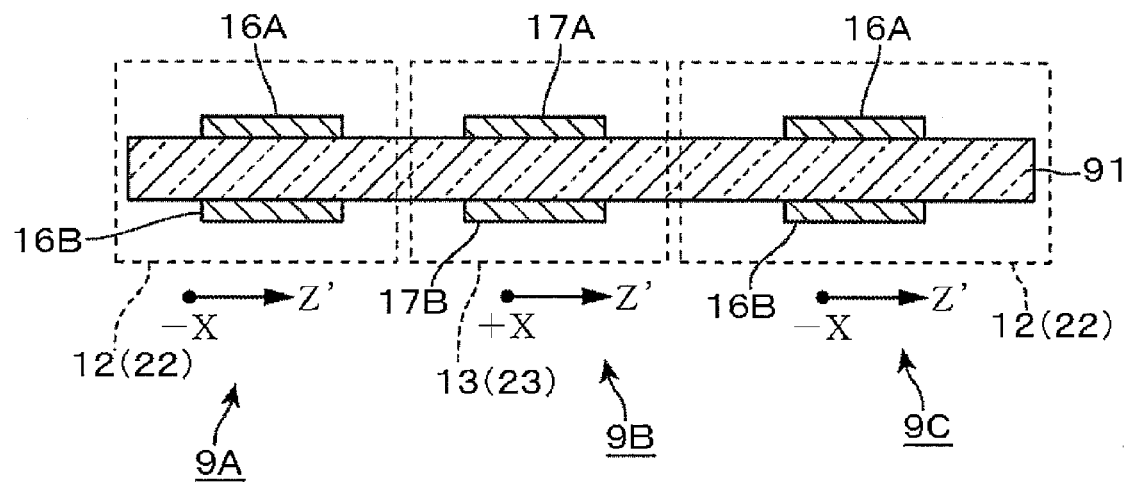
FIG. 16 is a longitudinal side view of the crystal resonator of the fifth embodiment.

A TCXO 100 according to a fifth embodiment will now be explained. FIG. 15 illustrates a top surface of crystal resonators 9A to 9C that constitute the TCXO 100, and FIG. 16 illustrates a side surface of the crystal resonators 9A to 9C. The fifth embodiment differs from the fourth embodiment in that a first vibrating region 12, a second vibration region 13, and a first vibrating region 12 are formed in this order on a single crystal wafer 91 along the Z' direction of the crystal wafer 91, and the vibrating regions 12, 13, and 12 respectively constitute the crystal resonators 9A, 9B, and 9C. The crystal resonator 9C is constituted identical to the crystal resonator 9A.

The two first vibrating regions 12 and 12 are partitioned by the second vibrating region 13, and thus elastic bonding between the first vibrations regions 12 and 12 is suppressed. Therefore, even if the characteristics of the two first vibrating regions 12 and 12 are the same, they can be treated as independent crystal resonators 9A and 9C. In a simulation, the present inventors have confirmed that elastic bonding does not occur between the first vibrating regions 12 and 12.

Figure 17:
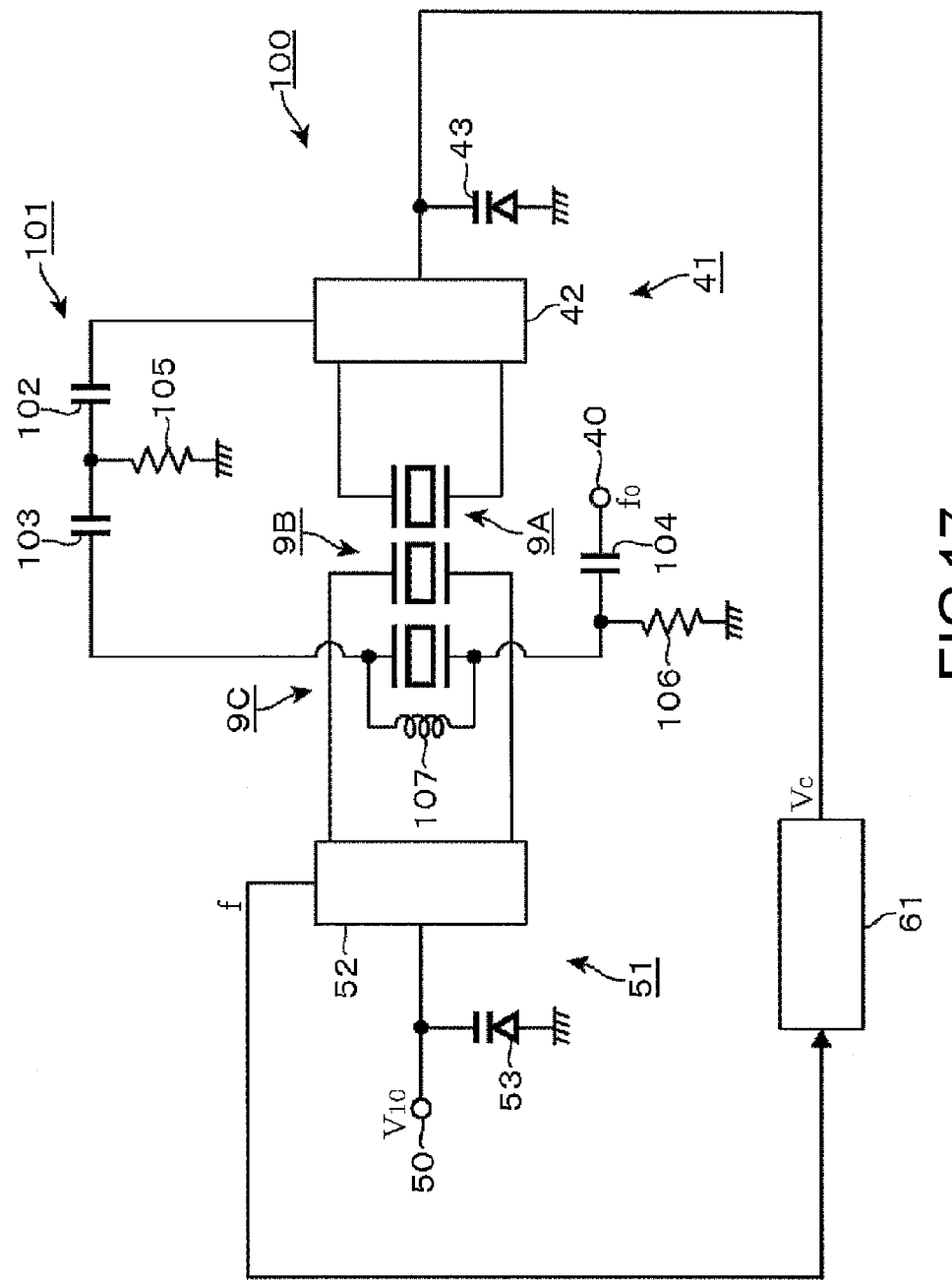
FIG. 17 is a circuit diagram of the TCXO of the fifth embodiment.

The constitution of the TCXO 100 is illustrated in FIG. 17, and will be briefly explained below. A filter circuit 101 consisting of the crystal resonator 9C is provided on the back stage of the TCXO 3 of the fourth embodiment, and output is retrieved from the output terminal 40 provided on the back stage of the filter circuit 90. The oscillating circuits 42 and 52 are Colpitts oscillating circuits including a transistor. The reason for providing such a filter circuit is as follows. A voltage waveform corresponding to an oscillating waveform of a crystal resonator is a sinusoidal wave, but the wave form of the sinusoidal wave is disturbed when it passes through the oscillating circuit portion. In other words, a voltage waveform output from the oscillating circuit 42 is distorted. The filter circuit 101 shapes the waveform so that the distortion is eliminated, and acts to cause a high purity sinusoidal wave (sinusoidal wave in which the distortion is suppressed) to be output. If the purity of the sinusoidal wave of the oscillation output is high, there is less noise than if it is low.

In order to suppress phase noise, it is conceivable to appropriately select the load capacity of the oscillating circuit or to reduce the drive current of the TCXO as much as possible. However, these measures may increase the production costs of the apparatus and increase the size of the apparatus. By providing the filter 101, such increases in the costs and the size of the apparatus can be suppressed.

The filter circuit 101 includes a serial circuit of capacitors 102 and 103, the crystal resonator 9C, and a capacitor 104. One end of a resistor 105 and one end of a resistor 106 are respectively connected to the ends of the serial circuit of the capacitor 103 and the crystal resonator 9C, and the other ends of the resistors 105 and 106 are grounded. The capacitor 102 is provided to cut a direct current, and the capacitors 103 and 104 and the resistors 105 and 106 constitute a filter that attenuates any frequency signals other than the target frequency signal.

Figure 18:
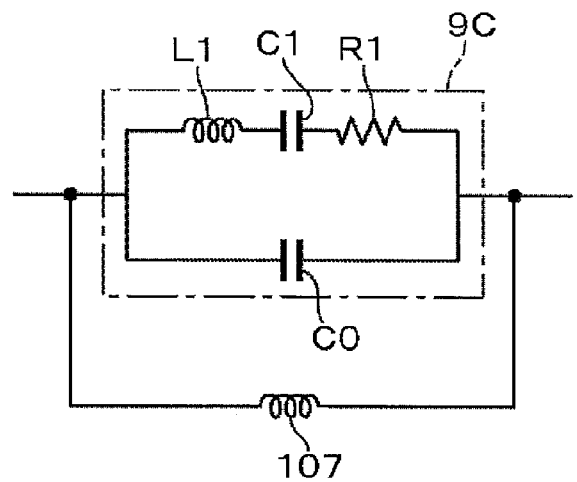
FIG. 18 is an equivalent circuit diagram of the crystal resonator of the TCXO of the fifth embodiment.

An inductor 107 is provided in parallel to the crystal resonator 9C. FIG. 18 illustrates an equivalent circuit of the crystal resonator 9C. L1 is an equivalent motional inductance, C1 is an equivalent motional capacitance, R1 is an equivalent motional resistance, and C0 is a shunt capacitance. The inductor 107 is set to a value that causes anti-resonance in the oscillating frequency (f0) together with the shunt capacitance C0. In other words, if the value of the inductance of the inductor 107 is L, L is set so that the following formula is established.

$$f0 = 1/\{2\pi \cdot \sqrt{(L \cdot C0)}\}$$

The equivalent motional capacitance C1 is much smaller than the shunt capacitance C0, and thus it can cause anti-resonance by C0 and L.

The operation of the TCXO 100 will now be explained. Similar to the TCXO 3 of FIG. 4, the control voltage $V_c$ is applied from the control voltage supply part 61 to the oscillating circuit 42 via the varicap diode 43 in accordance with the temperature of the crystal resonator 9B, the crystal resonator 9A oscillates at a frequency in accordance with the control voltage $V_c$, and a frequency signal is output from the oscillating circuit 42. Although not shown in the drawings, the control voltage supply part 61 includes an A/D converter and a D/A converter. The output of the auxiliary oscillating part 51 including the crystal resonator 9B is subjected to digital conversion by the A/D converter, and then an output calculated in the control voltage supply part 61 based on the above output is subjected to analog conversion by the D/A converter and is applied to the varicap diode 43.

The sinusoidal wave output from the crystal resonator 9A as described above becomes distorted upon passing through the oscillating circuit 42. Since a crystal resonator outputs a sinusoidal wave when excited, the distortion in the distorted sinusoidal wave is eliminated when the wave passes through the crystal resonator 9C for wave shaping. The shunt capacitance C0 of the crystal resonator 9C for wave shaping causes anti-resonance together with the inductor 107, and thus the target frequency (f0) signal is blocked from passing through the shunt capacitance C0 side. Therefore, since the frequency signal passes mostly through mechanically oscillating portions, the passage of noise included in the frequency signal is blocked, and phase noise is reduced. In the TCXO 100, in addition to reducing the phase noise in this way, the same effects as the TCXO 3 are obtained. Further, since the crystal resonator 9C for constituting a filter is formed on the crystal wafer 91 that constitutes the crystal resonator 9A for obtaining oscillation output and the crystal resonator 9B for constituting a temperature sensor, the size of the apparatus can be reduced.

Figure 19:
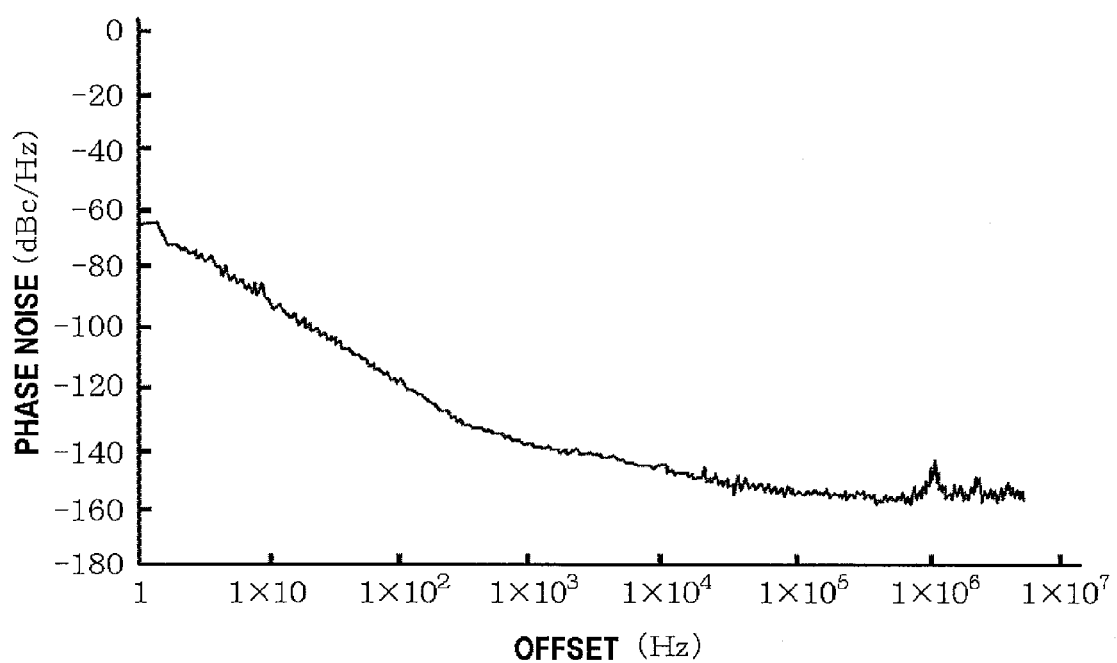
FIG. 19 is a graph illustrating the temperature characteristics of the TCXO of the fifth embodiment.
Figure 20:
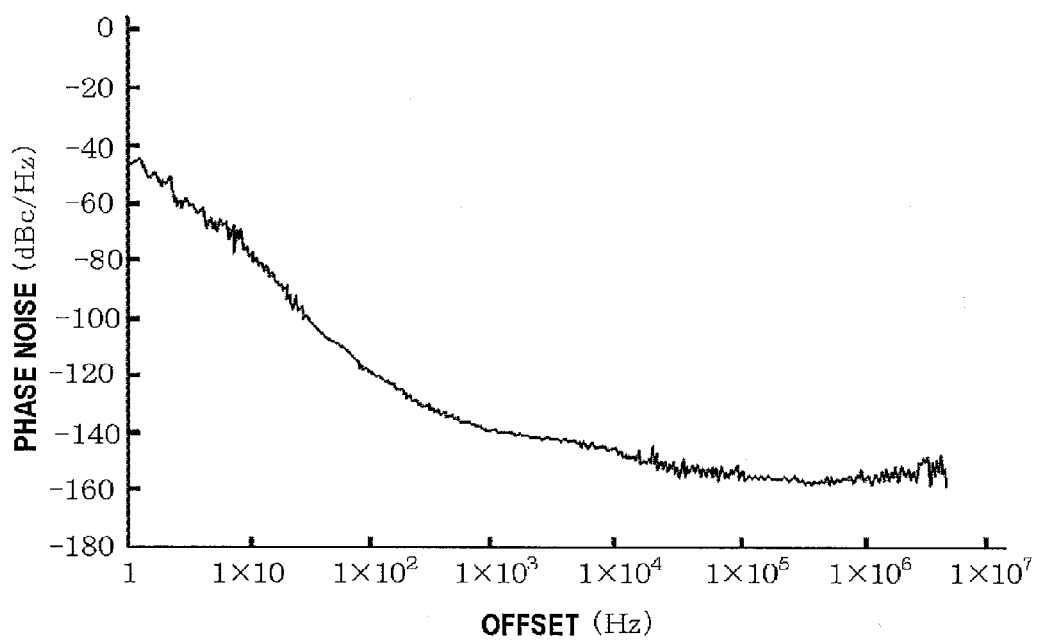
FIG. 20 is a graph illustrating the temperature characteristics of the TCXO of the third embodiment.

An experiment was conducted to investigate the phase noise characteristics of the outputs of the TCXO 100 and the TCXO 3. FIG. 19 is a graph illustrating the phase noise characteristics of the TCXO 100, and FIG. 20 is a graph illustrating the phase noise characteristics of the TCXO 3. The amount of deviation (offset unit: Hz) from the center frequency of the TCXO is shown on the horizontal axis, and the difference from the output of the center frequency, or in other words the phase noise (unit: dBc/Hz), is shown on the vertical axis. Comparing the characteristics in the vicinity of 1 to 10 Hz, where the offset is small, the phase noise of the TCXO 100 is lower. Therefore, it was demonstrated that by providing the filter circuit 90, the phase noise can be reduced, and the Q value can be increased.

Sixth Embodiment

A TCXO 110 according to a sixth embodiment includes a filter like the TCXO 100, but the filter is constituted as an MCF (monolithic crystal filter). The reason for providing an MCF is as follows. When constituting, for example, a PLL apparatus into which a TCXO is incorporated and outputting a digital signal based on the output of the TCXO, if the phase noise level is high at a frequency that is relatively far from the main vibration of the TCXO, the pulse waveform of the digital signal becomes distorted. The phase noise can be reduced by providing an MCF.

Figure 21:
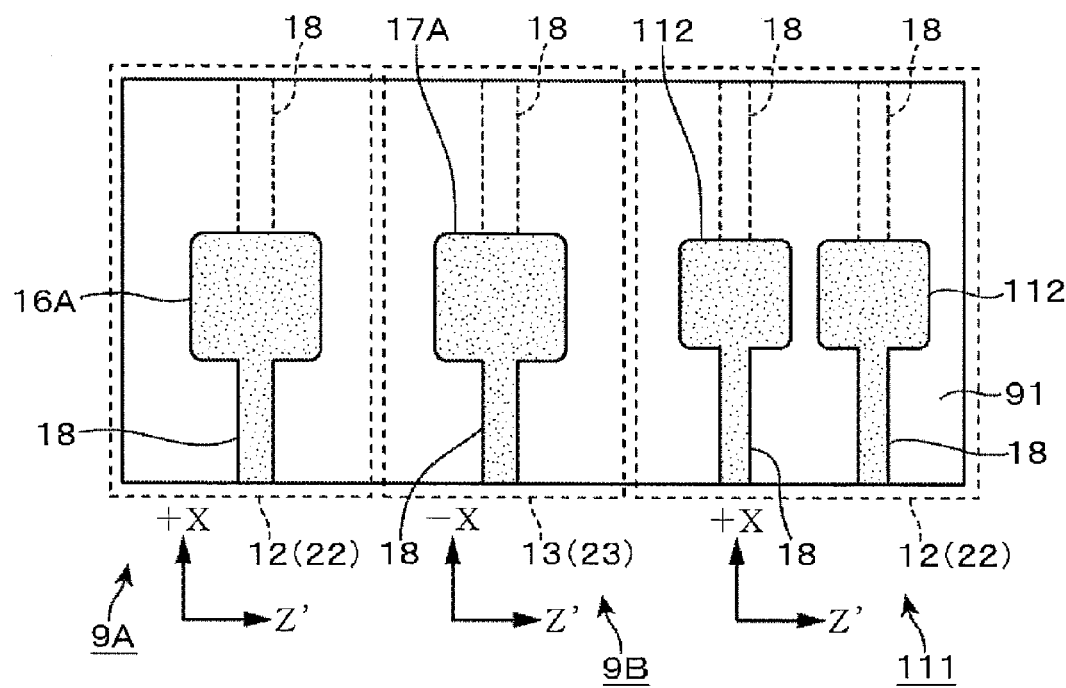
FIG. 21 is a plan view of a crystal resonator for constituting a TCXO of a sixth embodiment.
Figure 22:
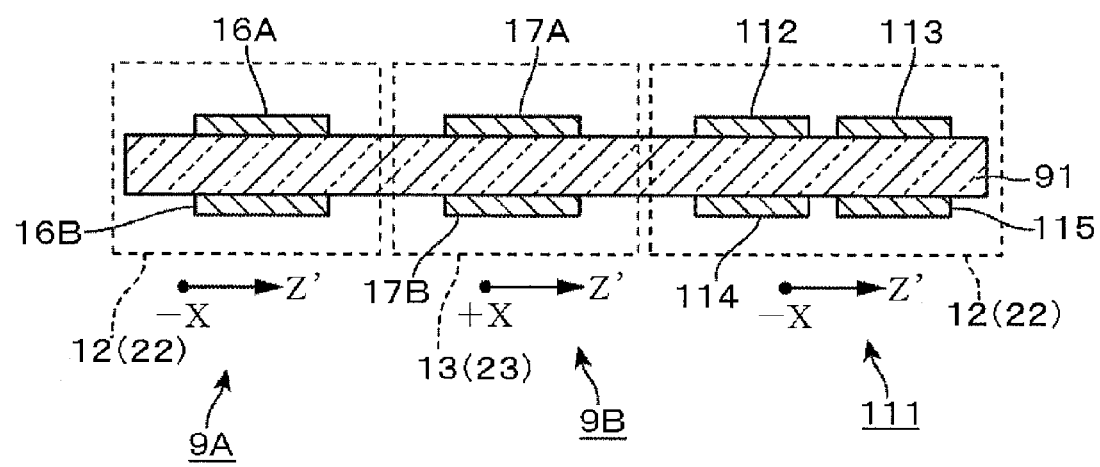
FIG. 22 is a longitudinal side view of the crystal resonator of the sixth embodiment.

FIGS. 21 and 22 respectively illustrate a top surface and a side surface of the crystal wafer 91 used in the TCXO 110. The sixth embodiment differs from the fourth embodiment in that an MCF 111 is formed instead of the crystal resonator 9C on the crystal wafer 91. The MCF 111 includes a first vibrating region 12 similar to the crystal resonator 9C, but the constitution of the electrodes is different. Electrodes 112 and 113 are provided at intervals in the Z' direction on the top surface side. Electrodes 114 and 115 are provided at intervals in the Z' direction on the underside surface side. The electrodes 112 and 114 oppose each other, and the electrodes 113 and 115 oppose each other. The electrode 112 is an input electrode of a filter, the electrode 114 is an output electrode of a filter, and the electrodes 113 and 115 are electrodes for grounding. Similar to the excitation electrodes explained above, leading electrodes 18 for connecting to a holder (not illustrated) that holds the crystal wafer 91 extend from the electrodes 112 to 115 toward the edges of the crystal wafer 91.

Figure 23:
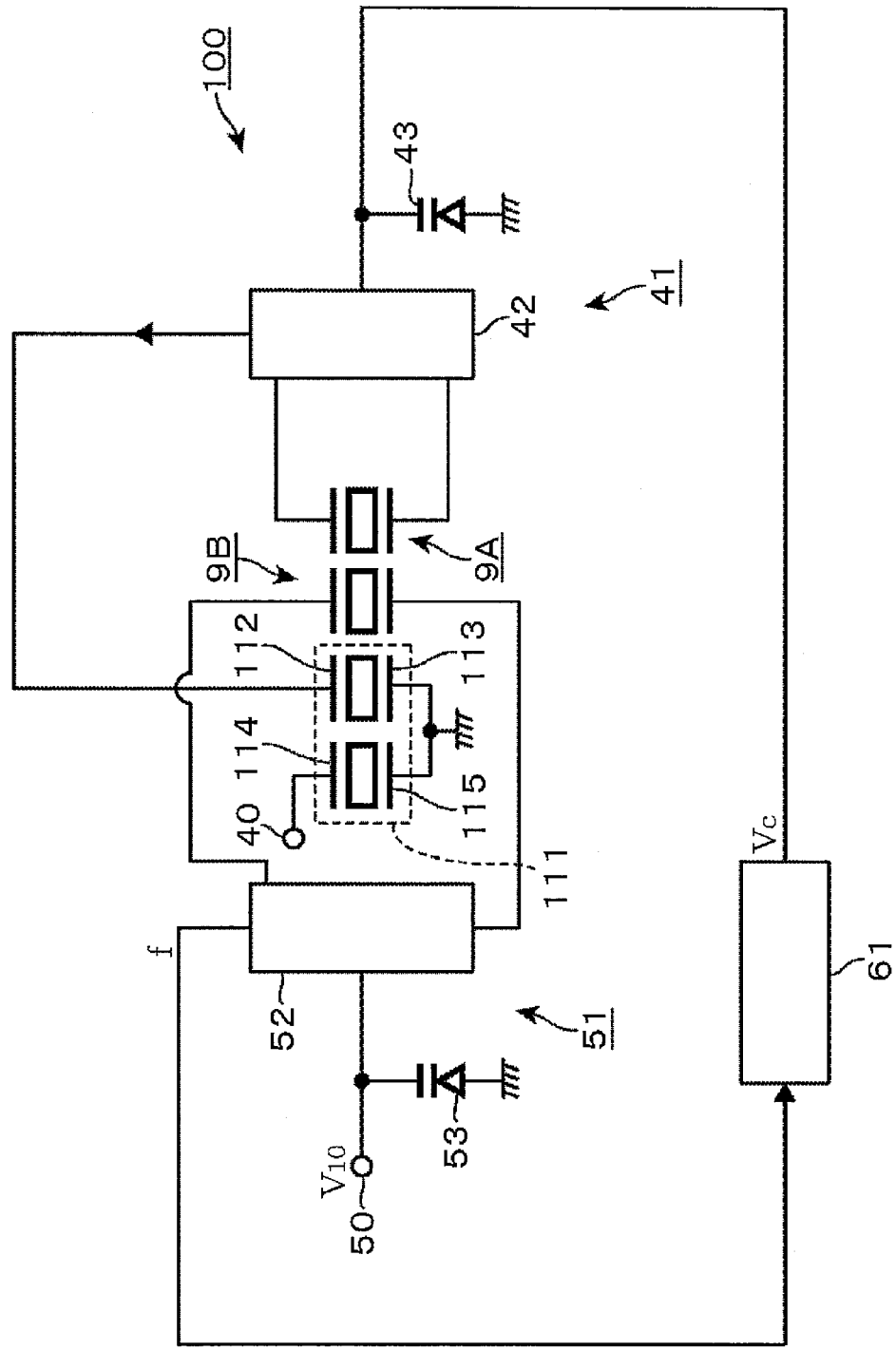
FIG. 23 is a circuit diagram of the TCXO of the sixth embodiment.

FIG. 23 illustrates a constitution of the TCXO 110. The MCF 111 is provided on the back stage side of the oscillating circuit 42 and the back stage of the MCF 111 is connected to the output terminal 40, so that an output from which phase noise has been eliminated is retrieved. The first vibrating region (filter formation region) 12 that constitutes the MCF 111 is partitioned from the first vibrating region 12 that constitutes the crystal resonator 9A by the second vibrating region 13, and thus elastic bonding between the vibrating regions 12 is suppressed. Therefore, deterioration of the characteristics for eliminating phase noise is minimized. Similar to the crystal resonator 9C, the MCF 111 is formed on the crystal wafer 91 that constitutes the crystal resonators 9A and 9B, and thus increases in the size of the apparatus and increases in the production costs can be prevented as in the fourth embodiment.

Figure 24:
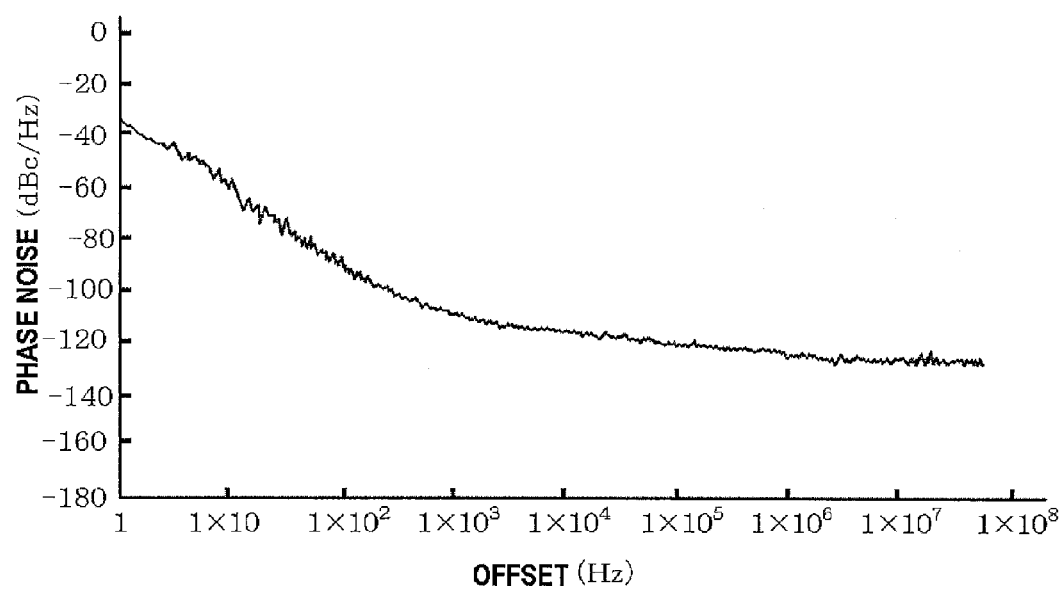
FIG. 24 is an equivalent circuit diagram of the crystal resonator of the TCXO of the sixth embodiment.
Figure 25:
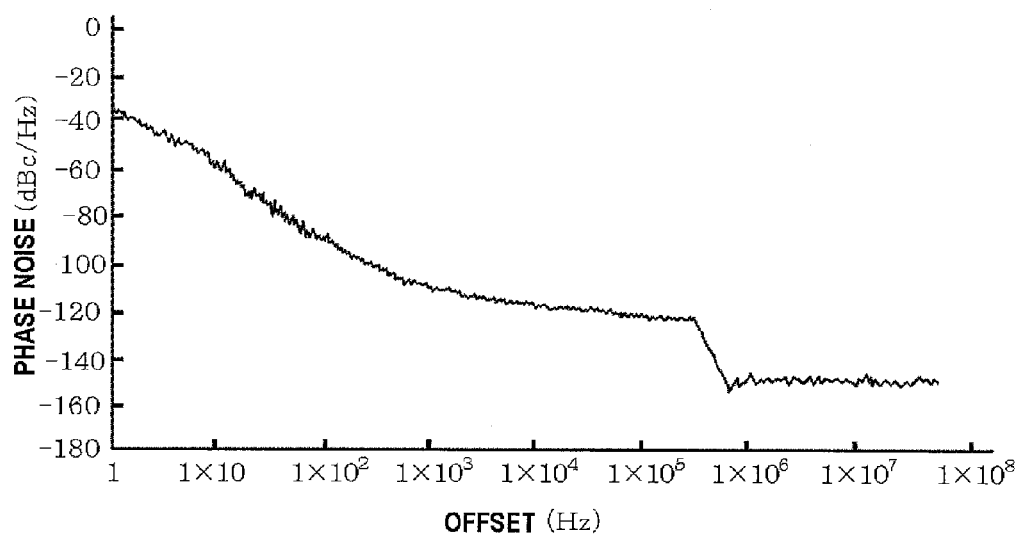
FIG. 25 is a graph illustrating the temperature characteristics of the TCXO of the sixth embodiment.

An experiment was conducted to investigate the phase noise characteristics of the outputs of the TCXO 110 and the TCXO 3. Similar to FIGS. 19 and 20, FIG. 24 illustrates the phase noise characteristics of the TCXO 110 and FIG. 25 illustrates the phase noise characteristics of the TCXO 3. Comparing the graphs of FIGS. 24 and 25, the phase noise levels are approximately the same when the offset frequency is in the vicinity of 1 to 100,000 Hz. However, at 100,000 Hz or greater, the phase noise level of the TCXO 110 is lower. This demonstrates the effects of providing the MCF 111.

The vibrating regions 12 and 13 of the crystal wafer 91 have the same thickness as each other in the fourth to sixth embodiments, but they can have different thicknesses from each other as in the first to third embodiments. Recesses 14 and 15 for partitioning the vibrating regions 12 and 13 can also be formed. Moreover, each of the vibrating region of crystal wafer 11 used for each TCXO of from the first to the third embodiment, can have the same thickness each other as each of the vibrating region in crystal wafer 91 in from the fourth to the sixth embodiment. In these cases, recesses 14 and 15 can be unformed among the vibrating regions.

Seventh Embodiment

Figure 26:
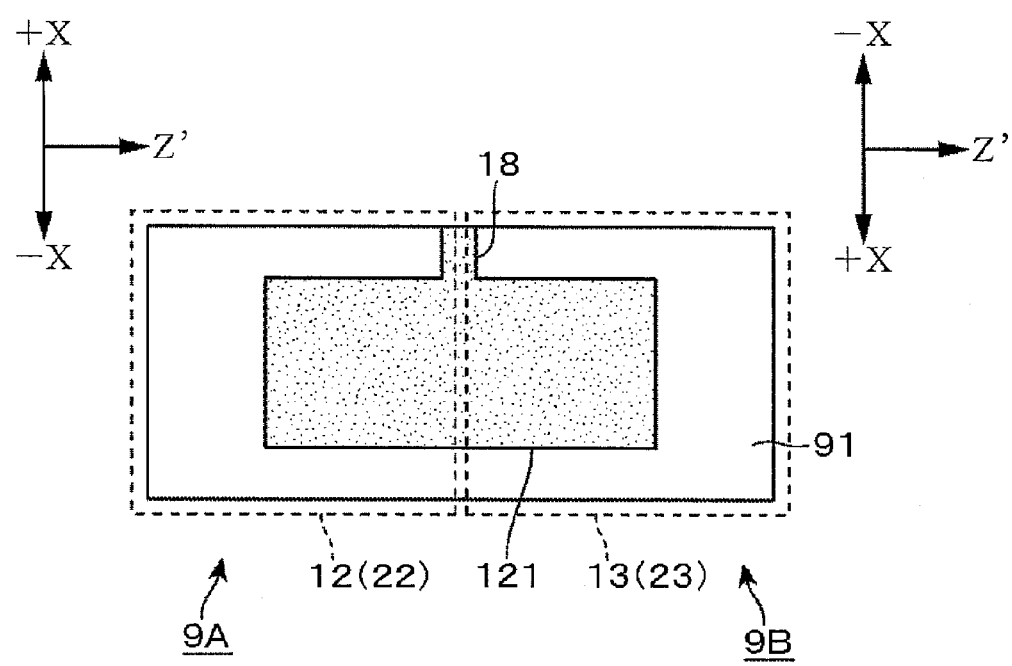
FIG. 26 is a plan view of a crystal resonator for constituting a TCXO of a seventh embodiment.
Figure 27:
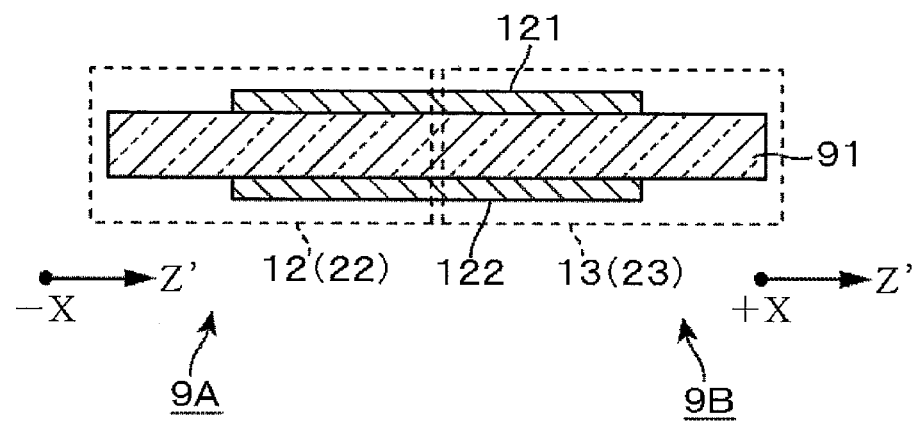
FIG. 27 is a longitudinal side view of the crystal resonator of the seventh embodiment.

Next, a TCXO 120 according to a seventh embodiment will be explained. FIGS. 26 and 27 illustrate crystal resonators 9A and 9B used in the TCXO 120. The seventh embodiments differs from the fourth to sixth embodiments in that the excitation electrodes 16A, 16B, 17A, and 17B are not provided on the top surface and underside surface of the crystal wafer 91, and excitation electrodes 121 and 122 are provided instead. The excitation electrodes 121 and 122 oppose each other, and are formed to straddle the vibrating regions 12 and 13. The frequency constant of the first vibrating region 12 is, for example, about 1.67 MHz·mm, and the frequency constant of the second vibrating region 13 is about 2.45 MHz·mm. The thicknesses of the vibrating regions 12 and 13 are the same.

Figure 28:
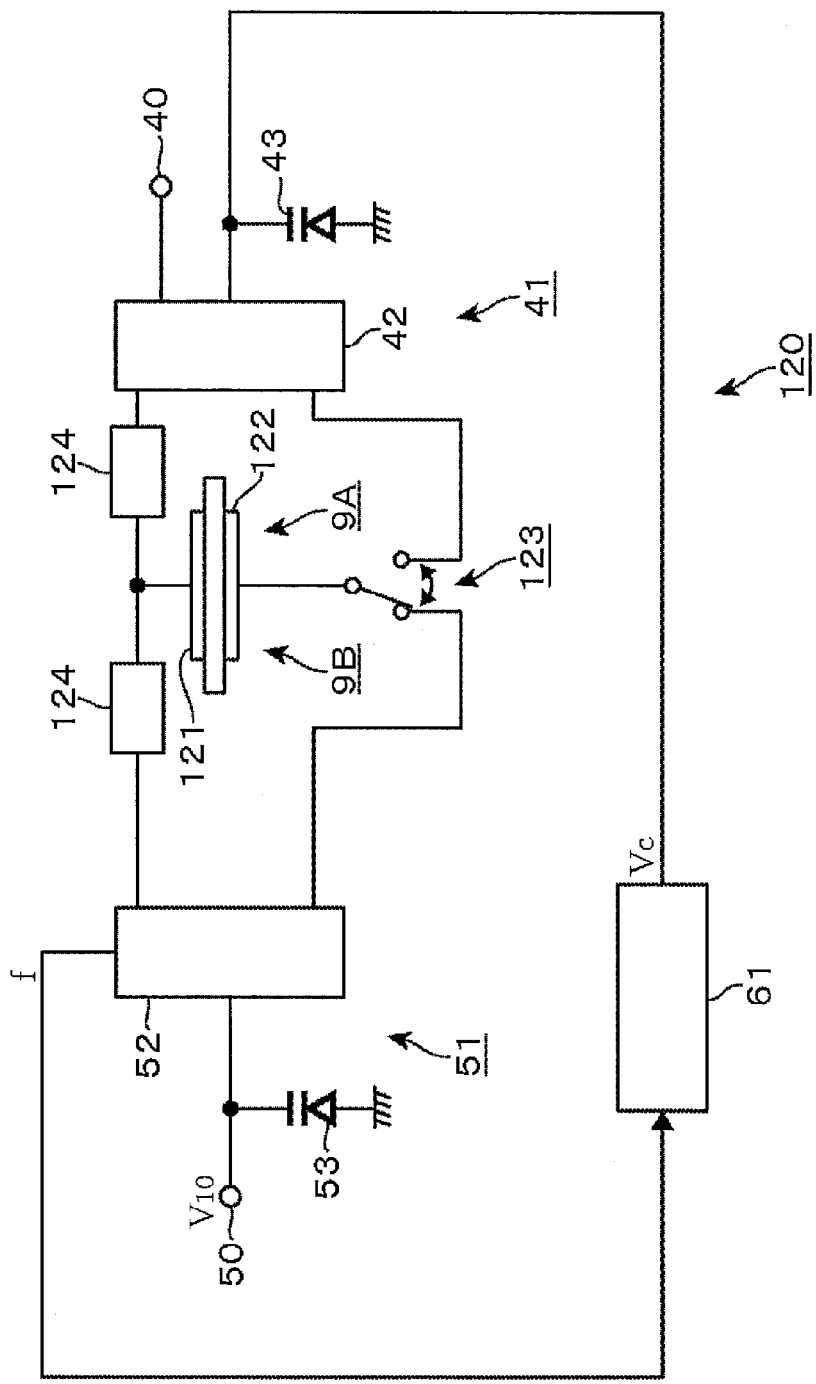
FIG. 28 is a circuit diagram of the TCXO of the seventh embodiment.

FIG. 28 illustrates the TCXO 120. The TCXO 120 is constituted in almost the same manner as the TCXO 3, so the following explanation will focus on the points of difference. A switch 123 is provided between the crystal resonators 9A and 9B and the oscillating circuits 42 and 52, and the excitation electrode 122 is connected to either one of the oscillating circuit 42 or 52. The excitation electrode 121 is connected to the oscillating circuits 42 and 52. In other words, one of the crystal resonators 9A and 9B is connected to the oscillating circuits 42 and 52 by the switch 123, but the switch 123 switches at high speed and thus the crystal resonators 9A and 9B vibrate substantially simultaneously. In the drawings, 124 and 124 denote filters provided between the excitation electrode 121 and the oscillating circuits 42 and 52.

Since the difference in the frequency constants between the vibrating regions 12 and 13 is rather large as mentioned above, the influence of the vibration of one region on the vibration of the other region is minimized even if the vibrating regions 12 and 13 vibrate substantially simultaneously. Therefore, the same effects as the TCXO 3 of the first and fourth embodiments can be obtained. The vibrating regions 12 and 13 cannot be visually distinguished from each other, and cannot be detected by another optical detection method. These regions can be distinguished by measuring the dielectric constants or by X-ray inspection, but such inspection methods have a disadvantage in that they require a relatively large amount of time. In particular, X-ray inspection devices for inspecting crystal wafers that have become increasingly smaller are expensive. However, in this embodiment, by forming the excitation electrodes so that they straddle the vibrating regions 12 and 13, it is not necessary to specify the border between the vibrating regions 12 and 13. Therefore, the production of the apparatus is easier compared to specifying a border between the vibrating regions 12 and 13 and then forming separate excitation electrodes in each vibrating region, and thus this embodiment has an advantage of suppressing the production costs.

An experiment was conducted to confirm the oscillation outputs when forming the crystal resonators as described above according to the seventh embodiment. A rectangular AT-cut crystal wafer 91 was prepared in which the length in the Z' direction is 5 mm and the length in the X' direction is 2.5 mm. The crystal wafer 91 oscillates at 26 MHz in a fundamental wave vibration mode. The crystal wafer 91 was subjected to a heat treatment to form the vibrating region 13.

Next, the excitation electrodes 121 and 122 were formed on the crystal wafer 91. The excitation electrodes 121 and 122 are constituted by layering an Au (gold) film on top of a Cr (chromium) film. The thickness of the Au film is approximately 100 nm. The shape of the excitation electrodes 121 and 122 is a rectangle whose length and height are both 1.8 mm, and they oppose each other as described above in order to cause vertical electric field excitation. The oscillating circuits 42 and 52 are Colpitts oscillating circuits, and their load capacity is 7 pF. The oscillating circuits 42 and 52 were connected to the excitation electrodes 121 and 122, and the output frequencies of the oscillating circuits 42 and 52 were investigated.

In the results, the output frequency from the oscillating circuit 42 was 27.104452 MHz, the output frequency from the oscillating circuit 52 was 55.755391 MHz, and the difference between the two was approximately 28 MHz. Thus, the oscillating frequencies greatly differed from each other. Therefore, it was confirmed that the vibration of one region did not influence the vibration of the other region.

The TCXO 120 can be produced so that the various parameters such as the size of the crystal wafer 91 and the size of the electrodes is as described in the above experiment. The principle of energy confinement by the excitation electrodes is also established by the crystal resonators 9A and 9B in this embodiment, and the surface area of the excitation electrodes can be appropriately adjusted so that appropriate energy confinement can be achieved. The vibrating regions are not limited to a fundamental wave vibration mode, and they can be made to oscillate in a high overtone vibration mode. The crystal resonators 9A and 9B of the seventh embodiment can be applied to the other embodiments as well.

In the above embodiments, the oscillating circuits 42 and 52 were constituted by Colpitts oscillating circuits. However, any oscillating circuit, such as a Pierce, Clapp, or Butler oscillating circuit, can be used. Also, a constitutional example of a TCXO was given as the crystal oscillator (oscillation apparatus), but the crystal oscillator can also be constituted as, for example, an OXCO (oven controlled crystal oscillator). Specifically, an oven whose internal temperature can be adjusted by a heater is constituted, and the crystal wafer that constitutes the crystal resonators is incorporated therein. Instead of a compensation voltage calculating part of the TCXO, a power adjusting part that adjusts the power supplied to the heater is provided. Similar to the TCXO 3 and the like, with regard to the oscillation output of the crystal resonator 1B (9B), a frequency detecting part detects the frequency, a temperature estimating part estimates the temperature within the oven based on the frequency, the power from the power adjusting part to the heater is controlled in accordance with the estimated temperature, and the temperature within the oven is maintained at a set temperature.

Further, the filter provided to the back stage of the oscillating circuit 42 is not limited to the MCF 111 or the filter circuit 101 described above, and a SAW filter can be constituted by the crystal wafer 11 (91). Also, a dielectric filter can be provided to the back stage of the oscillating circuit 42. An amp or buffer circuit can be provided between the oscillating circuit 42 and the MCF 111 or the filter circuit 101, and electron noise of the amp and buffer circuit can be eliminated in the MCF 111 and the filter circuit 101. In addition, the surface area of the vibrating regions 12 and 13 and that of the excitation electrodes 16 and 17 can be the same or different from each other.

What is claimed is:

1. A crystal resonator comprising:
   a first vibrating region provided on a crystal wafer,
   a second vibrating region provided on the crystal wafer, the second vibrating region having a different thickness and a different positive/negative orientation of the X-axis from those of the first vibrating region, and
   excitation electrodes which are provided respectively on the first vibrating region and the second vibrating region for causing the vibrating regions to vibrate independently.

2. The crystal resonator according to claim 1, wherein a recess is formed on the crystal wafer between the first vibrating region and the second vibrating region.

3. The crystal resonator according to claim 1, wherein one of the first vibrating region and the second vibrating region is an AT-cut region.

4. A crystal oscillator comprising the crystal resonator according to claim 1.

5. The crystal oscillator according to claim 4, further comprising a control means that controls an oscillating frequency of the first vibrating region by controlling a control voltage for causing the first vibrating region to oscillate based on an oscillating frequency of the second vibrating region.

6. A crystal oscillator comprising:
   a first vibrating region provided on a crystal wafer,
   a second vibrating region provided on the crystal wafer, the second vibrating region having a different positive/negative orientation of the X-axis than those of the first vibrating region,
   excitation electrodes which are provided respectively on the first vibrating region and the second vibrating region for causing the vibrating regions to vibrate independently,
   a first oscillating circuit for causing the first vibrating region to oscillate,
   a second oscillating circuit for causing the second vibrating region to oscillate, and
   a control means that estimates a temperature of the crystal wafer based on an oscillating frequency of the second vibrating region and controls an oscillating frequency from the first oscillating circuit based on the estimated temperature.

7. The crystal oscillator according to claim 6, wherein a filter formation region that constitutes a filter into which a signal from the first oscillating circuit is input is provided in a region that is different from the first vibrating region and the second vibrating region on the crystal wafer.

8. The crystal oscillator according to claim 7, wherein the first vibrating region and the filter formation region are partitioned by the second vibrating region.

9. The crystal oscillator according to claim 6, wherein the excitation electrodes are formed to straddle the first vibrating region and the second vibrating region.

* * * * *